United States Patent
Jones, III

(10) Patent No.: US 9,053,268 B1
(45) Date of Patent: *Jun. 9, 2015

(54) ANALYTIC ANTENNA DESIGN FOR A DIPOLE ANTENNA

(75) Inventor: Thomas O. Jones, III, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 995 days.

This patent is subject to a terminal disclaimer.

(21) Appl. No.: 12/854,955

(22) Filed: Aug. 12, 2010

(51) Int. Cl.
*G06F 17/10* (2006.01)
*G06F 17/50* (2006.01)
*H01Q 3/44* (2006.01)
*H01Q 9/40* (2006.01)

(52) U.S. Cl.
CPC .............. *G06F 17/5036* (2013.01); *H01Q 9/40* (2013.01); *H01Q 3/44* (2013.01)

(58) Field of Classification Search
None
See application file for complete search history.

(56) References Cited

U.S. PATENT DOCUMENTS

| | | | |
|---|---|---|---|
| 3,836,977 A | 9/1974 | Wheeler | |
| 4,635,068 A | 1/1987 | Wheeler et al. | |
| 5,719,794 A * | 2/1998 | Altshuler et al. | 703/1 |
| 6,437,737 B1 * | 8/2002 | Azzarelli et al. | 342/360 |
| 6,834,380 B2 * | 12/2004 | Khazei | 716/115 |
| 7,012,568 B2 | 3/2006 | Desclos et al. | |
| 7,015,857 B1 * | 3/2006 | Pozgay | 342/174 |
| 7,061,440 B2 * | 6/2006 | Choo et al. | 343/728 |
| 7,209,085 B2 | 4/2007 | Rowell et al. | |
| 7,830,318 B2 * | 11/2010 | Rhodes et al. | 343/710 |
| 7,911,371 B2 * | 3/2011 | Karam | 342/25 C |
| 7,913,198 B2 * | 3/2011 | Holter | 716/100 |
| 8,121,821 B1 * | 2/2012 | Jones | 703/1 |
| 8,368,156 B1 * | 2/2013 | Jones, III | 257/428 |
| 2003/0150099 A1 * | 8/2003 | Lebaric et al. | 29/600 |
| 2003/0229861 A1 * | 12/2003 | Quigley et al. | 716/1 |
| 2004/0120411 A1 * | 6/2004 | Walton et al. | 375/260 |
| 2005/0057409 A1 * | 3/2005 | Choo et al. | 343/728 |
| 2005/0113952 A1 * | 5/2005 | Shimizu et al. | 700/97 |
| 2006/0256018 A1 * | 11/2006 | Soler Castany et al. | 343/700 MS |
| 2007/0147535 A1 * | 6/2007 | Niu et al. | 375/267 |
| 2008/0095260 A1 * | 4/2008 | Vaidyanathan | 375/267 |

(Continued)

OTHER PUBLICATIONS

G. Armbrecht, O. Klemp, and H. Eul "Spherical mode analysis of planar frequency-independent multi-arm antennas based on its surface current distribution" Advance in Radio Science, pp. 25-32, 2006.*

(Continued)

*Primary Examiner* — Kibrom K Gebresilassie
(74) *Attorney, Agent, or Firm* — SPAWAR Systems Center Pacific; Kyle Eppele; Stephen E. Baldwin

(57) ABSTRACT

The present invention relates to an analytic antenna design for a dipole antenna by eliminating or reducing antenna pattern nulls and impedance anti-resonances.

In accordance with one aspect of the present invention, a method for designing a wide bandwidth includes the steps of defining a charge distribution in terms of at least one form factor related parameter where the Legendre polynomial expansion of the electrostatic potential is uniquely linked to each eigenmode of the wideband antenna, and modifying one or more eigenmodes of the wideband antenna by modifying the charge distribution and unique linked Legendre polynomial coefficient.

8 Claims, 24 Drawing Sheets

(56) References Cited

U.S. PATENT DOCUMENTS

2010/0214156 A1* 8/2010 Karam ................. 342/149
2011/0273326 A1* 11/2011 Shirakawa ............ 342/25 R

OTHER PUBLICATIONS

H. R. Stuart, "Eigenmode analysis of a two Element Segmented Capped Monopole Antenna" IEEE, pp. 2980-2988, vol. 57, No. 10, Oct. 2009.*

G. Armbrecht, O. Klemp, and H. Eul "Spherical mode analysis of planar frequency-independent multi-arm antennas based on its surface current distribution" pp. 25-32, 2006.*

H. R. Stuart, "Eigenmode analysis of a two Element Segmented Capped Monopole Antenna" pp. 2980-2988, Oct. 2009.*

H. R. Stuart "Eigenmode Analysis of Small Multielement Spherical Antennas" pp. 2841-2851, Sep. 2008.*

* cited by examiner

ANALYTIC ANTENNA DESIGN FOR A DIPOLE ANTENNA

FEDERALLY-SPONSORED RESEARCH AND DEVELOPMENT

This invention (Navy Case No. 100.570) was developed with funds from the United States Department of the Navy. Licensing inquiries may be directed to Office of Research and Technical Applications, Space and Naval Warfare Systems Center, San Diego, Code 72120, San Diego, Calif., 92152; telephone (619)553-2778; email: T2@spawar.navy.mil.

CROSS-REFERENCE TO RELATED APPLICATIONS

This application is related to pending application Ser. No. 11/959,715, filed Dec. 19, 2007, now U.S. Pat. No. 8,121,821, entitled "Quasi-Static Design Approach For Low Q Factor Electrically Small Antennas", assigned to the same assignee as the present application, and the details of which are hereby incorporated by reference.

BACKGROUND

1. Field

This invention relates to antennas. More particularly, this invention relates to an analytic antenna design for a dipole antenna by eliminating or reducing antenna pattern nulls and impedance anti-resonances

2. Background

In 1947, H. A. Wheeler published formulas for qualifying the antenna radiation Q of electrically small antennas in terms of the antenna's physical size. Shortly thereafter, L. J. Chu published additional formulas and theories on this subject, also using the antenna's size as a metric. As the Q of an antenna is inversely related to the antenna's frequency response, of significant interest to antenna engineers is the theoretical Q limits imposed by Wheeler and Chu for given antenna dimensions. Numerous scientists have attempted to corroborate and expand on these dimension-based formulas in terms of actual measurements of scale models, computational models, or revised formulas based on electrical parameters, with some degree of success. However, these approaches have typically yielded solutions that are either very cumbersome, or do not provide an elegant approach for designing low Q antennas.

Therefore, there has been a long-standing need in the antenna community for simpler methods and systems for the design of wide bandwidth antennas, based on a low Q criterion.

SUMMARY

The present invention relates to an analytic antenna design for a dipole antenna by eliminating or reducing antenna pattern nulls and impedance anti-resonances.

In accordance with one aspect of the present invention, a method for designing a wide bandwidth includes the steps of defining a charge distribution in terms of at least one form factor related parameter where the Legendre polynomial expansion of the electrostatic potential is uniquely linked to each eigenmode of the wideband antenna, and modifying one or more eigenmodes of the wideband antenna by modifying the charge distribution and unique linked Legendre polynomial coefficient.

DETAILED DESCRIPTION

Figure 1:
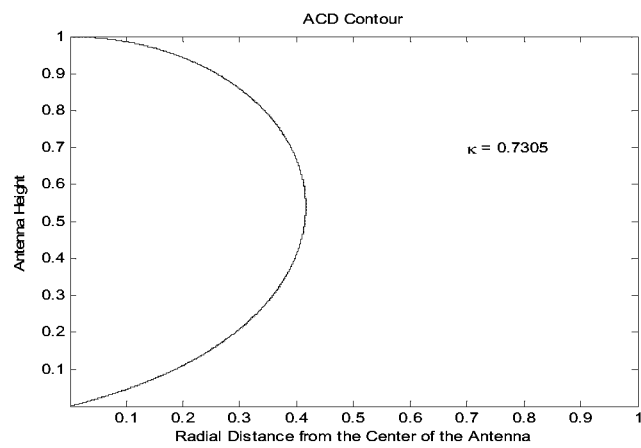
FIG. 1 is an illustration of the contour of an exemplary ACD antenna according to an embodiment of this invention.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that such subject matter may be practiced without these specific details.

Quasi-Static, Low Q Derivation

The radiation Q of an antenna is defined as the ratio of the average stored energy to the average radiated energy, and is usually understood as a metric for qualifying the radiation efficiency of the antenna. This important relationship can be expressed as:

$$Q = ωE_s/E_r, \quad (1)$$

where $E_r$ is the radiated energy and $E_s$ is the stored energy.

For an electrically small antenna, the antenna behaves very much like a capacitor, exhibiting quasi-static field behavior, and consequently the instantaneous stored energy $E_s$ can be expressed in terms of the well known quasi-static relationship:

$$E_s = \frac{1}{2}Vq_{peak}, \quad (2)$$

where V is the voltage and $q_{peak}$ is the charge. For a time-harmonic current signal $I(t)=I_{peak}\sin(ωt)$, Eq. 2 can be recast as $$E_s = \frac{I_{peak}^2}{2Cω^2}, \quad (3)$$

where C is the capacitance, w is the radian frequency (2πf). If I(t) is expressed as an rms current ($I_{rms}$), which is equivalent to an average static current, then the average stored energy $E_s$ in a capacitor can be expressed as:

$$E_s = \frac{I_{rms}^2}{Cω^2}. \quad (4)$$

And the radiated energy $E_r$ in the capacitor can be expressed as:

$$E_r = R_r I_{rms}^2, \quad (5)$$

where $R_r$ is the resistance in terms of real radiation.

By using the earlier definition of Q (Eq. 1) and combining the above expressions, the following relationship can be developed:

$$Q = \frac{1}{ωCR_r}. \quad (6)$$

The above Eq. 6 expresses the Q for a quasi-static field about an electrically small antenna, in terms of electrical parameters of the antenna. However, to be able to arrive at the antenna's electrical parameters as expressed in Eq. 6, the significance of the antenna's shape and its affect on charge distribution must be developed.

It is well understood that the charge on a perfectly conducting antenna is distributed about the surface of the antenna. Since there is an intrinsic relationship between the electric field generated by a source charge, the electric field on the surface of the antenna can be expressed as a function of the distribution of the source charges. For the quasi-static case, this relationship can generally be expressed as:

$$Φ = \iiint_v \frac{q}{4πε_0 r_{dist}} dv, \quad (7)$$

where Φ is the electric field potential, q is the charge, ε is the permittivity, and $r_{dist}$ is the distance between the observer and the charge distribution.

For a perfectly conducting surface, the electric field potential is constant, therefore, a solution can be developed for Eq. 7 describing the exact charge distribution on the antenna surface. Therefore, given a simple shape, the charge distribution and attendant antenna parameters can usually be found using a direct, closed form solution. However, due to the complex shapes of most antennas, an indirect solution using numerical techniques must often be employed. As one of ordinary skill in the art can appreciate, numerous researchers have devoted their studies to solving Eq. 7 for assorted geometries and therefore there are a plethora of publications dedicated to this subject matter. These prior art approaches predominately pre-define a shape and thereafter derive a solution from the shape.

For some embodiments of the exemplary methods and apparatuses demonstrated herein, the charge distribution is pre-defined and thereafter the shape of the antenna is generated, based on the corresponding solution. To provide a degree(s) of freedom in the shaping of the antenna, a factor $\kappa$, which operates as dimension variable, is inserted into the defining equation(s). From a solution of the defining equation(s), the respective Q-related parameters can be generated to form an expression for Q. Since $\kappa$ is a variable in the Q expression, it can operate as a solution for a given value of Q. Therefore, varying values of $\kappa$ will result in varying values of Q. If the Q expression is minimized, then the corresponding value of $\kappa$ will define a minimum Q antenna. Accordingly, antennas with minimum or otherwise low Q values can be designed by this exemplary method. The application of the exemplary method described will be demonstrated by example below, as derived from differing charge distributions. It should be noted that by use of the exemplary methods and apparatuses described herein, several novel antennas having very low Q values have been developed.

ACD

The Asymptotic Conical Dipole (ACD), sometimes referred to as a Hertzian monopole, is developed, having a constant charge distribution along its vertical axis. The antenna has a length L, and is given a total charge q running from $z=-L/2$ to $z=+L/2$. The electric potential $\Phi$ for this antenna is defined from the following cylindrical equation:

$$\Phi(\rho, z) = \frac{q}{4\pi\varepsilon_0 L}\ln\left(\frac{1+\tau}{1-\tau}\right), \quad (8)$$

where $\epsilon_0$=free space permittivity, $$\tau = \frac{L}{R_1 + R_2},$$

$R_1 = \sqrt{(z-L/2)^2+\rho^2}$, and $R_2 = \sqrt{(z+L/2)^2+\rho^2}$.

On the z-axis, this equation simplifies to $$\tau = \frac{L}{|2z|}$$

for $|z|>|L/2|$. If h is the actual height of the antenna, we can devise a dimensional variable $\kappa$ such that $\kappa=L/h$. Therefore, the charge distribution per unit length is $q/\kappa h$. Using this substitution and incorporating image theory, Eq. 8 can be rewritten as:

$$\Phi(\rho, z) = \frac{q}{4\pi\varepsilon_0\kappa h}\ln\left(\frac{(1+\tau_m)(1-\tau_i)}{(1-\tau_m)(1+\tau_i)}\right), \quad (9)$$

where $$\tau_m = \frac{\kappa h}{R_f + R_t}$$

is for the monopole, $$\tau_i = \frac{\kappa h}{R_f + R_b}$$

is for the image monopole, $R_t = \sqrt{(z-\kappa h)^2+\rho^2}$ is the distance from $\rho$, z to the top of the monopole, $R_f = \sqrt{z^2+\rho^2}$ is the distance from $\rho$, z to the feed point and $R_b = \sqrt{(z+\kappa h)^2+\rho^2}$ is the distance from $\rho$, z to the bottom of the image monopole. It is noted that Eq. 9 expresses the electric potential $\Phi$ with the dimensional variable $\kappa$ embedded within. The capacitance can be calculated by first evaluating the above $R_t$, $R_f$, and $R_b$ equations at the point $\rho=0$, $z=h$, which is known to be location of the maximum potential location, to result in $R_t=(z-\kappa h)$, $R_f=z$, $R_b=(z\pm\kappa h)$, $$\tau_m = \frac{\kappa h}{2z - \kappa h}, \text{ and } \tau_i = \frac{\kappa h}{2z + \kappa h}$$

for $z \geq \kappa h$. Substituting these values into Eq. 9 yields $$\Phi(\rho, z) = \frac{q}{4\pi\varepsilon_0 \kappa h}\ln\left(\frac{z^2}{(z-\kappa h)(z+\kappa h)}\right). \quad (10)$$

Further evaluating this expression at $\rho=0$, $z=h$ results in $$\Phi(0, h) = \frac{q}{4\pi\varepsilon_0 \kappa h}\ln(1-\kappa^2). \quad (11)$$

Since $q=C\Phi$, then the capacitance is $$C(\kappa) = \frac{4\pi\varepsilon_0 \kappa h}{-\ln(1-\kappa^2)}. \quad (12)$$

The effective height $h_e$ for the line charge distribution is $h_e=\kappa h/2$. The radiation resistance $R_r$ is $$R_r(\kappa) = 40\left(\frac{\kappa h k}{2}\right)^2, \quad (13)$$

where k is the wave number ($2\pi/\lambda$). The Q can now be expressed as $$Q(\kappa) = \frac{-3\ln(1-\kappa^2)}{(\kappa h k)^3}. \quad (14)$$

It should be noted that the quantities C, $R_e$ and Q depend on the wave number k and the height h, which can be fixed as constants. A minimum value of Q can be found by taking the derivative of Eq. 14 and setting it to zero resulting in $$\frac{d(-\ln(1-\kappa^2)/\kappa^3)}{dk} = \quad (15)$$

$$\frac{1}{\kappa^4(1-\kappa^2)}[(2-3\ln(1-\kappa^2))\kappa^2 + 3\ln(1-\kappa^2)] = 0.$$

As this is a non-trivial equation, Eq. 15 can be solved by any one of several methods of numerical iteration, that are well known in the art, to finally result in $\kappa=0.7304719548370$.

This value of $\kappa$ can now define the dimensional aspects of an antenna that conforms to a constant line charge distribution as defined above. Additionally, as it was derived from a minimized Q relationship, it also defines the dimensional aspects of an antenna that has a minimum Q. Of course, if a nonminimum solution was sought, then Eq. 14 would be evaluated for different values of κ, to provide a spectrum of Q values. Accordingly, different antenna shapes would result from the different κ's, corresponding to different Q values.

In summary, the antenna parameters for the ACD are:

$$Q = \frac{5.87}{(kh)^3}$$

$$h_e = 0.3652h$$

$$R_r = 5.336(hk)^2$$

$$C = 1.064 * 10^{-10}h$$

Based on the minimum K value, and for a given k and h, the contour of an exemplary ACD antenna was generated. FIG. 1 is an illustration of a cross-sectional view of the exemplary ACD antenna.

P$_1$ Legendre Polynomial Charge Distribution

Various current distribution functions, in addition to a constant line charge, can be chosen, according to design preference. Accordingly, in this exemplary embodiment, a first order Legendre Polynomial (P$_1$) charge distribution is used on a monopole antenna. The P$_1$ charge distribution is linear and defined on the z axis from z=−L/2 to z=+L/2. The static potential equation for this charge in cylindrical coordinates is $$\Phi(\rho, z) = \int_{-L/2}^{L/2} \frac{P_1(2x/L)}{\sqrt{(x-z)^2 + \rho^2}} dx = \frac{2z}{L}\left(\ln\left(\frac{1+\tau}{1-\tau}\right) - 2\tau\right), \quad (17)$$

where, $$\tau = \frac{L}{R_1 + R_2},$$

L is the length, $R_1 = \sqrt{(z-L/2)_2 + \rho^2}$ and $R_2 = \sqrt{(z+L/2)^2 + \rho^2}$. If h is the height of the antenna, the line charge must be less than h by a factor κ<1. The above Eq. 17 represents the potential field for both the monopole and its image, that is, L=2κh.

Our assumption is that the total charge on the monopole is q. The required scale factor, 2q/κh, that enables this assumption is $$q = \frac{2q}{\kappa h} \int_0^{\kappa h} P_1(z/\kappa h) dz. \quad (18)$$

With Eq. 18, the resulting potential field equation becomes $$\Phi(\rho, z) = \frac{2q}{4\pi\varepsilon_0 \kappa h} \frac{z}{\kappa h}\left(\ln\left(\frac{1+\tau}{1-\tau}\right) - 2\tau\right), \quad (19)$$

where $$\tau = \frac{2\kappa h}{R_1 + R_2},$$

$R_1 = \sqrt{(z-\kappa h)^2 + \rho^2}$ and $R_2 = \sqrt{(z+\kappa h)_2 + \rho^2}$. The maximum potential is known to be at z=h and ρ=0 resulting in the simplified expression $$\Phi(0, h) = \frac{2q}{4\pi\varepsilon_0 \kappa^2 h}\left(\ln\left(\frac{1+\kappa}{1-\kappa}\right) - 2\kappa\right). \quad (20)$$

Using principles described in solving for the ACD antenna, the capacitance becomes $$C(\kappa) = 4\pi\varepsilon_0 \frac{\kappa^2 h}{2\left(\ln\left(\frac{1+\kappa}{1-\kappa}\right) - 2\kappa\right)}. \quad (21)$$

Given that the effective height for the P$_1$ charge distribution is h$_e$=2κh/3. The radiation resistance is $$R_r(\kappa) = 40\left(\frac{2\kappa h k}{3}\right)^2, \quad (22)$$

and Q is $$Q(\kappa) = \frac{27\left(\ln\left(\frac{1+\kappa}{1-\kappa}\right) - 2\kappa\right)}{8(hk)^3 \kappa^4}. \quad (23)$$

Again, Q is found to be formulated in terms of κ, k and h. Eq. 23 can be minimized by taking its derivative and setting it to zero:

$$\frac{dQ}{d\kappa} = \frac{27}{4(kh)^3}\left(\frac{\frac{2}{\kappa}\ln\left(\frac{1+\kappa}{1-\kappa}\right) - 3}{(1-\kappa^2)\kappa^5}\right)\left[\kappa^2 - \left(1 - \frac{1}{\frac{2}{\kappa}\ln\left(\frac{1+\kappa}{1-\kappa}\right) - 3}\right)\right] = 0. \quad (24)$$

The term in the square bracket can be solved by iteration; the quantity, $$\frac{2}{\kappa}\ln\left(\frac{1+\kappa}{1-\kappa}\right) - 3,$$

being a slowly changing function. The solution is found to be κ=0.69609037983344.

In summary, the parameters for this exemplary antenna become:

$$Q = \frac{4.7031}{(hk)^3} \quad (25)$$

$$h_e = .46406h$$

-continued $$R_c = 8.614(kh)^2$$

$$C = 8.22178 \ast 10^{-11} h$$

$$h_e = 0.46406h$$

$$R_r = 8.614(kh)^2$$

$$C = 8.22178 \ast 10^{-11} h \quad (25)$$

The radiation resistance for this exemplary $P_1$ charge antenna is 60% higher than the exemplary constant charge ACD antenna and the Q is 20% lower. This is offset by a 23% decrease in the capacitance of the antenna.

Figure 2:
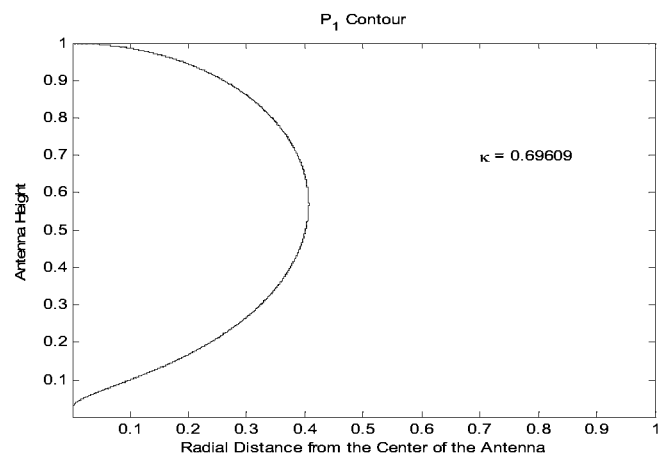
FIG. 2 is an illustration of the contour of an exemplary $P_1$ charge antenna, according to an embodiment of this invention.
Figure 3:
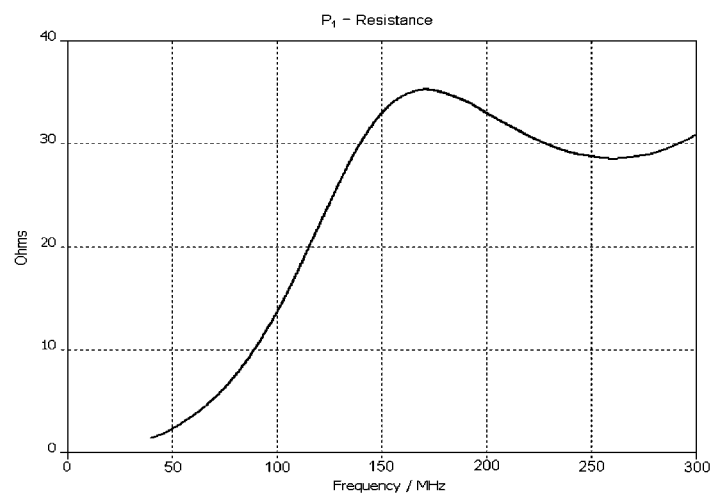
FIG. 3 is a graph of the computed resistance of an exemplary $P_1$ charge antenna, according to an embodiment of this invention.
Figure 4:
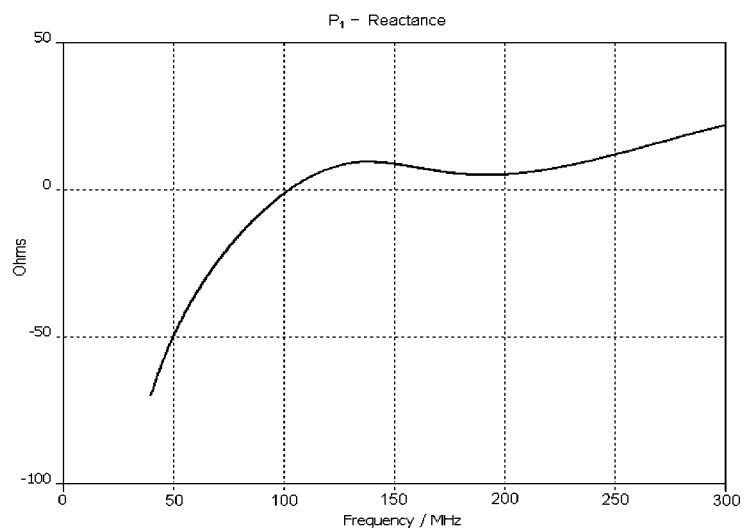
FIG. 4 is a graph of the computed reactance of an exemplary $P_1$ charge antenna, according to an embodiment of this invention.
Figure 5:
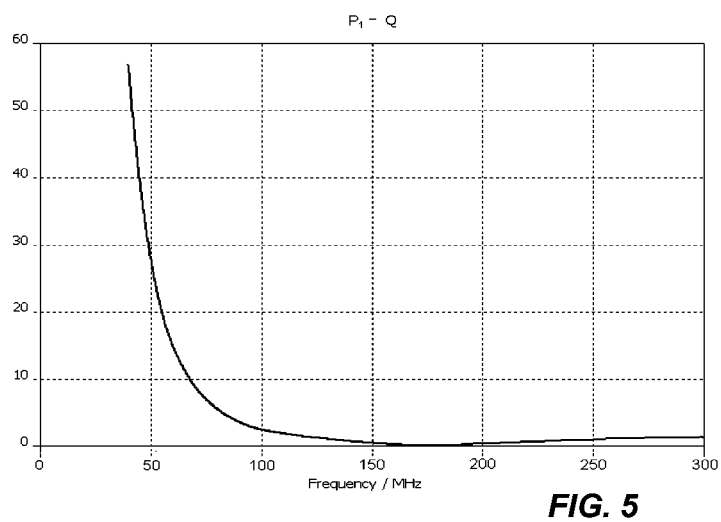
FIG. 5 is a graph of the computed charge of an exemplary $P_1$ charge antenna, according to an embodiment of this invention.

Using a κ value of 0.696 a contour of the exemplary $P_1$ charge antenna was generated. FIG. 2 is a cross-sectional illustration of the exemplary $P_1$ charge antenna. In addition to generating the contour, a numerical model was created to simulate the exemplary $P_1$ charge antenna's response using Numerical Electromagnetic Code (NEC) and also Computer Simulation Technology (CST) Microwave Studio®. These simulations were performed using varying values of κ, the CST computed minimum being 0.661. The results of the simulation are shown in FIG. 3, which is a graph showing the computed resistance of the exemplary $P_1$ charge antenna as a function of frequency, for a κ value of 0.661. FIG. 4 is a graph showing the computed reactance of the exemplary $P_1$ charge antenna as a function of frequency, for the same κ value. And FIG. 5 is a graph showing the computed charge distribution of the exemplary $P_1$ charge antenna as a function of frequency, again for the same κ value.

Figure 6:
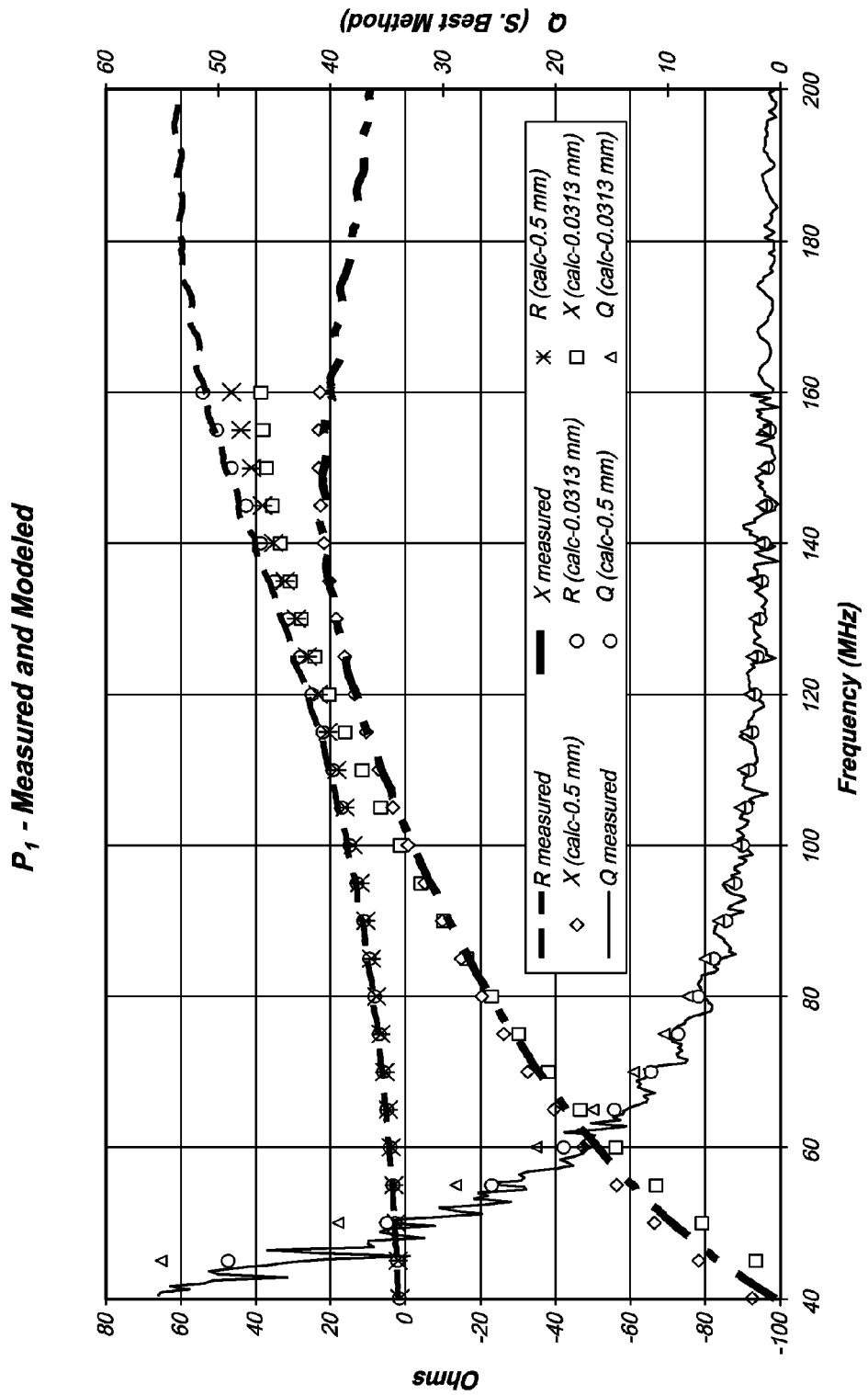
FIG. 6 is a graph comparing experimental measurements of an exemplary $P_1$ charge antenna to computer simulated/predicted values, according to an embodiment of this invention.

Based on the results tabulated above, a half meter physical model was constructed of wires and experimental measurements were performed. FIG. 6 details the comparison of the physical model measurements to the computer simulated/predicted values. It is noted that the measured and computed values appear to track reasonably well throughout the experiment.

It should be noted that typical antennas are known to exhibit anti-resonance or poor radiation characteristics at frequencies that are one half wavelength the longest dimension of the antenna. Examination of FIG. 6 shows that the response is very smooth throughout the one half wavelength region. Therefore, this exemplary $P_1$ charge antenna does not suffer from typical half wavelength anti-resonance problems.

$P_0$+Point Charge Antenna

Progressing from the exemplary $P_1$ charge antenna, another charge distribution was evaluated. A "bulb" antenna charge distribution was generated, using a constant line charge distribution ($P_0$) with a point charge at the end of the constant line charge distribution. In essence, the bulb antenna charge distribution is the charge distribution of the constant line charge ACD antenna modified with a point charge at the top.

The total charge q is split between the line charge and the point charge, with the point charge being αq and the line charge being $(1-\alpha)q/\kappa h$, where α is a proportionality constant. Using similar dimensional constraints as imposed in the constant line charge ACD antenna, the expression for the potential field distribution becomes $$\Phi(\rho, z) = \frac{(1-\alpha)q}{4\pi\varepsilon_0 \kappa h} \ln\left(\frac{(1+\tau_m)(1-\tau_i)}{(1-\tau_m)(1+\tau_i)}\right) + \frac{\alpha q}{4\pi\varepsilon_0 R_t} - \frac{\alpha q}{4\pi\varepsilon_0 R_b}. \quad (26)$$

This potential is known to be maximum at ρ=0 and z=h, resulting in Eq. 26 being recast as $$\Phi(0, h) = \frac{-(1-\alpha)q}{4\pi\varepsilon_0 \kappa h} \ln(1-\kappa^2) + \frac{2\alpha\kappa q}{4\pi\varepsilon_0 h(1-\kappa^2)}. \quad (27)$$

The capacitance can be found to be $$C(\kappa, \alpha) = \frac{4\pi\varepsilon_0 \kappa h}{-(1-\alpha)\ln(1-\kappa^2) + \frac{2\alpha\kappa^2}{(1-\kappa^2)}}. \quad (28)$$

The effective height $h_{e\!f\!f}$ is $$h_{e\!f\!f}(\kappa,\alpha) = (1+\alpha)\kappa h/2. \quad (29)$$

And the radiation resistance is $$R_r(\kappa,\alpha) = 10[\kappa h k(1+\alpha)]^2. \quad (30)$$

Using free space, the resulting Q expression becomes $$Q(\alpha, \kappa) = \frac{3}{(1+\alpha)^2 (\kappa k h)^3} \left[\frac{2\alpha\kappa^2}{(1-\kappa^2)} - (1-\alpha)\ln(1-\kappa^2)\right]. \quad (31)$$

The minimum value Q is found by numerically evaluating Eq. 31 for a range of α values. The value of κ for the minimum Q is given in the following Table 1.

TABLE 1

| α | κ | Minimum Q | R | C |
|---|---|---|---|---|
| 0.5 | 0.609 | 33.77 | 2.29 | 41.2 pF |
| 0.6 | 0.600 | 32.26 | 2.53 | 39.1 pF |
| 0.7 | 0.593 | 30.84 | 2.79 | 37.0 pF |
| 0.8 | 0.587 | 29.52 | 3.06 | 35.2 pF |
| 0.9 | 0.582 | 28.29 | 3.35 | 33.5 pF |
| 0.99 | 0.578 | 27.26 | 3.63 | 32.2 pF |

Using the α value of 0.9 (meaning 90% of the total charge on the point) the "bulb" antenna parameters are $$Q = \frac{4.061}{(kh)^3}$$

$$h_e = 0.5529h$$

$$R_r = 12.22 \ast (kh)^2$$

$$C = 6.7 \ast 10^{-11} h.$$

$$h_e = 0.5529h.$$

$$R_r = 12.22 \ast (kh)^2$$

$$C = 6.7 \ast 10^{-11} h$$

Figure 7:
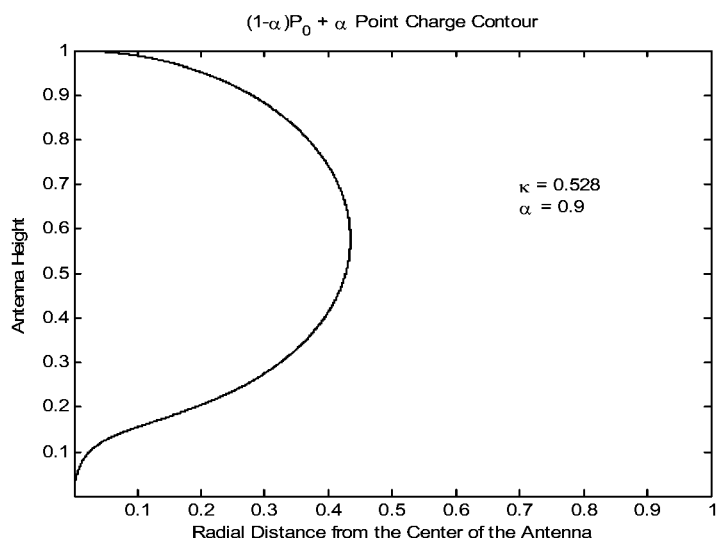
FIG. 7 is an illustration of the contour of an exemplary $(1-\alpha)P_0+\alpha$ point charge antenna, according to an embodiment of this invention.

Of interesting note is that the Q value is diminishing, as compared to the previous exemplary antennas. FIG. 7 is an illustration of a cross-sectional view of the exemplary $(1-\alpha) P_0 + \alpha$ point charge ("bulb") antenna demonstrated herein. Also, as a means of validation, this exemplary antenna model exhibited similar characteristics to a "bulb" antenna modeled by R. M. Kalafus, with the principal exception that Kalafus' antenna uses a finite feed point.

A comparison of the Q performance was also made to Chu's theoretical minimum. Chu expresses the theoretical minimum Q of an antenna as $$Q_{Chu} = \frac{1}{(kh)^3} + \frac{1}{kh}. \tag{32}$$

Figure 8:
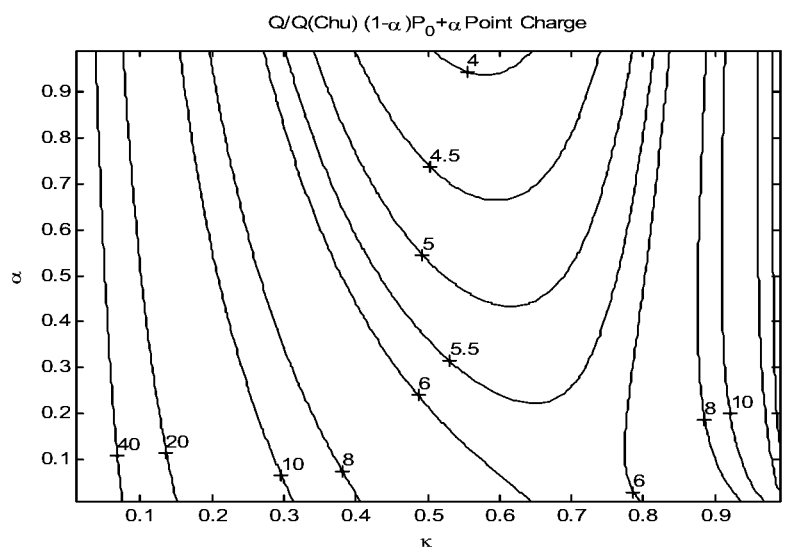
FIG. 8 is a graph of the $Q/Q_{Chu}$ ratio as a function of $\alpha$ using an optimal $\kappa$, for an exemplary $(1-\alpha)P_0+\alpha$ point charge antenna, according to an embodiment of this invention.

Using Eq. 32, only to the first order, a comparison of the $Q/Q_{Chu}$ ratio for the above exemplary antenna was made, for varying values of α, as a function of κ. FIG. 8 is a plot of this comparison.

$P_1$+Point Charge Antenna

The above demonstrated exemplary $P_0$+point charge model can be modified by using a $P_1$ feed line rather than a constant feed line. As previously described, the $P_1$ charge distribution is a "linear" charge distribution versus a "constant" charge distribution, as in the case of $P_0$. For this formulation, the net charge q is split between the linear charge and the point charge with the point charge quantity being αq and the line charge quantity being 2(1−α)q/κh.

The resulting expression for the potential becomes $$\Phi(\rho, z) = \frac{2(1-\alpha)q}{4\pi\varepsilon_0 \kappa h} \frac{z}{\kappa h}\left(\ln\left(\frac{1+\tau}{1-\tau}\right) - 2\tau\right) + \frac{\alpha q}{4\pi\varepsilon_0 R_t} - \frac{\alpha q}{4\pi\varepsilon_0 R_b}. \tag{33}$$

Eq. 33 can be evaluated at ρ=0 and z=h, resulting in $$\Phi(0, h) = \frac{2(1-\alpha)q}{4\pi\varepsilon_0 \kappa^2 h}\left(\ln\left(\frac{1+\kappa}{1-\kappa}\right) - 2\kappa\right) + \frac{2\alpha\kappa q}{4\pi\varepsilon_0 h(1-\kappa^2)}. \tag{34}$$

The capacitance becomes $$C(\kappa, \alpha, h) = \frac{4\pi\varepsilon_0 \kappa^2 h}{2(1-\alpha)\left(\ln\left(\frac{1+\kappa}{1-\kappa}\right) - 2\kappa\right) + \frac{2\alpha\kappa^3}{(1-\kappa^2)}}. \tag{35}$$

The effective height is $$h_{\mathit{eff}} = (1-\alpha)2\kappa h/3 + \alpha\kappa h. \tag{36}$$

The radiation resistance is $$R_r = 40[\kappa h_{\mathit{eff}} k(2/3 + \alpha/3)]^2. \tag{37}$$

The Q becomes $$Q(\alpha, \kappa, h) = \frac{27}{4(2+\alpha)^2 \kappa^4 (kh)^3}\left[2(1-\alpha)\left(\ln\left(\frac{1+\kappa}{1-\kappa}\right) - 2\kappa\right) + \frac{2\alpha\kappa^3}{(1-\kappa^2)}\right]. \tag{38}$$

Using similar procedures as applied to the previous examples, the minimum value of Q can be found by numerically evaluating Eq. 38 for varying α, κ values. Table 2 below details the resulting evaluation.

TABLE 2

| α | κ | Minimum Q | R | C |
|---|---|---|---|---|
| 0.5 | 0.611 | 30.39 | 2.84 | 36.8 pF |
| 0.6 | 0.602 | 29.85 | 2.99 | 35.9 pF |
| 0.7 | 0.595 | 29.07 | 3.15 | 34.8 pF |

TABLE 2-continued

| α | κ | Minimum Q | R | C |
|---|---|---|---|---|
| 0.8 | 0.588 | 28.42 | 3.30 | 33.9 pF |
| 0.9 | 0.582 | 27.78 | 3.47 | 33.0 pF |
| 0.99 | 0.578 | 27.21 | 3.63 | 32.1 pF |

For large values of α, the addition of a $P_1$ distribution does little to change the performance of the antenna, as compared to the previously modeled antenna. For the case of α=0.9, this antenna's parameters are $$Q = \frac{3.988}{(kh)^3}$$

$$h_e = 0.5626h$$

$$R_r = 12.666*(kh)^2$$

$$C = 6.6*10^{-11}h.$$

$h_e$=0.5626h.

$R_r$=12.66*$(kh)^2$ $C$=6.6*$10^{-11}h$

Figure 9:
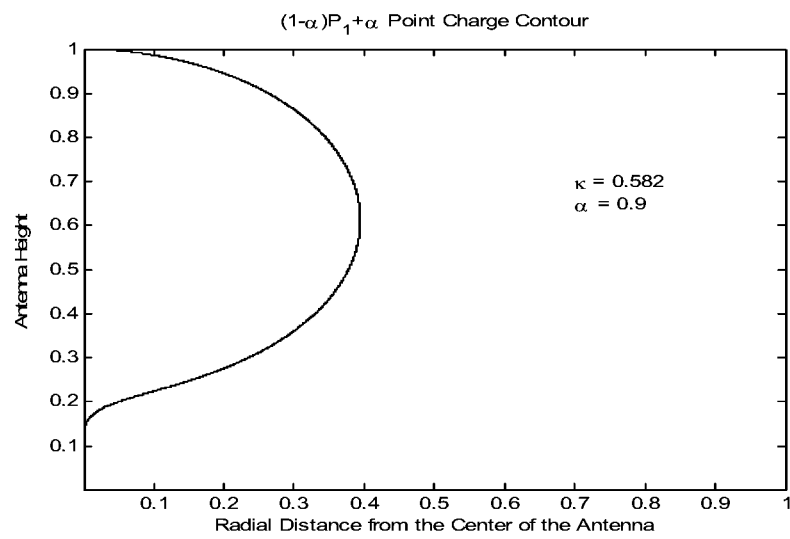
FIG. 9 is an illustration of the contour of an exemplary $(1-\alpha)P_0+\alpha$ point charge antenna, according to an embodiment of this invention.

By using a $P_1$ distribution rather than a constant distribution, only a slight improvement is demonstrated over the $P_0$ distribution for modest values of α. For large values of α, the values will converge in the limit. FIG. 9 is an illustration of the contour of this exemplary (1−α)$P_1$+α point charge antenna.

$P_1$ and $P_3$ Legendre Polynomial Charge Distribution

It should be understood that Q is defined by the stored energy in the near field and far fields of the antenna. Part of the stored energy is in the higher order moments of these fields. These moments could be reduced by adding a higher order charge distribution to account for these higher order field moments. In the following exemplary antenna, a higher order charge distribution term, Legendre polynomial $P_3$, is added to the charge distribution. It should be noted that other polynomials or basis functions (not being Legendre in form) may be used without departing from the spirit and scope of this invention.

It should be understood that the fields created by differing basis functions, for example, Legendre polynomials −$P_1$, $P_2$, $P_3$, ..., $P_n$, the respective line charge distributions operate with independent degrees of freedom with different angular and radial dependence. If using Legendre polynomials, the radial and angular dependence can be shown to be $P_n(\theta)/r^{n+1}$ (where is θ measured from the z axis) for $P_n$ (see Appendix for details). Mathematically, a surface constructed from a sequence of multipole functions should quickly converge.

In the following example, the Legendre polynomial $P_3$ with a coefficient $\alpha_3$ ($\alpha_3 P_3$) is added to a $P_1$ linear charge distribution. The Q can be further reduced by adding a $\alpha_5 P_5$ term. This shifts the $\alpha_3$ value some but reduces the error term to $P_7(\theta)/r^7$. An alternate approach is to algebraically calculate the multipole distribution (on the z axis) for each $P_{2m+1}$ polynomial and solve the equation for the coefficients $\alpha_3$ and $\alpha_5$ to eliminate the $P_3(\theta)/r^4$ and $P_5(\theta)/r^6$ terms in the multipole expansion. (See Appendix for example). In addition, since the shape of the feed point is determined by the line charge distribution, combinations of $P_1$, $P_3$, $P_5$, etc. can be used to parameterize the shape of the feed point and the input impedance for high frequencies.

Based on the above observations, the static potential charge distribution on the z axis from $z=-L/2$ to $z=L/2$ is $$\Psi_3(\rho, z) = \int_{-L/2}^{L/2} \frac{P_3(2x/L)}{\sqrt{(x-z)^2 + \rho^2}} = \quad (39)$$

$$\frac{20}{L^3}\left[\frac{5}{12}Lz(R_1 + R_2) - 2z\tau\left(\frac{11}{6}z^2 + \frac{L^2}{12} - \frac{2}{3}\rho^3\right) + \right.$$

$$\left. z\left(z^2 - \frac{3}{2}\rho^2\right)\ln\left(\frac{1+\tau}{1-\tau}\right)\right] - \frac{3z}{L}\left(\ln\left(\frac{1+\tau}{1-\tau}\right) - 2\tau\right),$$

(Note: the above three lines are one equation)
where $$\tau = \frac{L}{R_1 + R_2},$$

L is the length, $R_1 = \sqrt{(z-L/2)^2 + \rho^2}$ and $R_2 = \sqrt{(z+L/2)^2 + \rho^2}$. If h is the height of the antenna, the line charge must be less than this height by a factor $\kappa < 1$. Eq. 40 represents both the monopole and image: $L = 2\kappa h$. The potential $\Phi$ can be re-expressed in terms of fields ($\Psi_1$ and $\Psi_3$) generated from the Legendre polynomials, the expression being $$\Phi(\rho, z) = \frac{2q}{\kappa h}[\Psi_1(\rho, z) + \alpha \Psi_3(\rho, z)], \quad (40)$$

where $\alpha$ is a coefficient for the contribution of the $\Psi_3$ term.

It should be noted that Eq. 40 can have a negative charge distribution. If the charge distribution is negative near the base of the antenna, the feed point is above ground level. If the charge distribution is negative at the top of the antenna, the feed point is at the base. In latter case, the negative charge distribution must be enclosed by the equal potential surface. If the equipotential surface cuts across the charge distributions the solution is understood to not be a valid solution.

Following procedures previously discussed, the total charge q on the monopole is $$q_{Net} = \frac{2q}{\kappa h}\int_0^{\kappa h}[P_1(z/\kappa h)\,dz + \alpha P_3(z/\kappa h)dz]. \quad (41)$$

Using a substitution of variables by letting $u = z/\kappa h$, the charge distribution as a function of the Legendre polynomials can be cast as $$q_{Net} = \frac{2q}{\kappa h}\left[\int_0^1 P_1(u)\,du + \alpha\int_0^1 P_3(u)\,du\right]. \quad (42)$$

Substituting the functions $P_1(u)$ and $P_3(u)$, and simplifying yields $$q_{Net} = q\left(1 - \frac{\alpha}{4}\right). \quad (43)$$

For $\alpha \leq \frac{2}{3}$, the feed point is at the ground and the total charge above the feed point is $q_{Net}$. For $\alpha > \frac{2}{3}$, the feed point is at $$z = \sqrt{\frac{3\alpha - 2}{5\alpha}}$$

and the total charge above the feed point is $$q_{fp} = q\left[\left(1 - \frac{\alpha}{4}\right) + \frac{(3\alpha - 2)^2}{20\alpha}\right].$$

Derivation of the radiation resistance is discussed in the appendix, resulting in $$R_r = 40\left(\frac{2\kappa hk}{3\left(1 - \frac{\alpha}{4}\right)}\right)^2 \text{ for } \alpha \leq 2/3 \quad (45)$$

$$R_r = 40\left(\frac{2\kappa hk}{3\left[\left(1 - \frac{\alpha}{4}\right) + \frac{(3\alpha - 2)^2}{20\alpha}\right]}\right)^2 \text{ for } \alpha > 2/3.$$

If $\alpha < -1$, the combination of $P_3$ and $P_3$ creates a negative charge distribution at the end of the wire. The negative charge distribution could cause the equipotential surface to cut cross the charge distributions which, as mentioned above, would generate an invalid solution. Therefore, the potential must be calculated near the end of the charge distribution to verify that the charge distribution is enclosed within the equipotential surface. This is demonstrated as $$\Psi_3(0, z) = \frac{5}{2}\left(\frac{2}{L}\right)^3\left[\frac{5}{6}Lz^2 - z\left(\frac{L}{z}\right)\left(\frac{11}{6}z^2 + \frac{L^2}{12}\right) + z^3\ln\left(\frac{1 + L/2z}{1 - L/2z}\right)\right] - \quad (45)$$

$$\frac{3}{2}\left[\frac{2z}{L}\left(\ln\left(\frac{1 + L/2z}{1 - L/2z}\right) - 2\frac{L}{2z}\right)\right].$$

Substituting $L = 2\kappa h$ recasts Eq. 46 as $$\Psi_3(0, z) = \frac{5}{2}\left(\frac{1}{\kappa h}\right)^3\left[\frac{5}{3}\kappa hz^2 - 2z\left(\frac{\kappa h}{z}\right)\left(\frac{11}{6}z^2 + \frac{(\kappa h)^2}{3}\right) + z^3\ln\left(\frac{z + \kappa h}{z - \kappa h}\right)\right] - \quad (46)$$

$$\frac{3}{2}\left[\frac{z}{\kappa h}\left(\ln\left(\frac{z + \kappa h}{z - \kappa h}\right) - 2\frac{\kappa h}{z}\right)\right].$$

Figure 10:
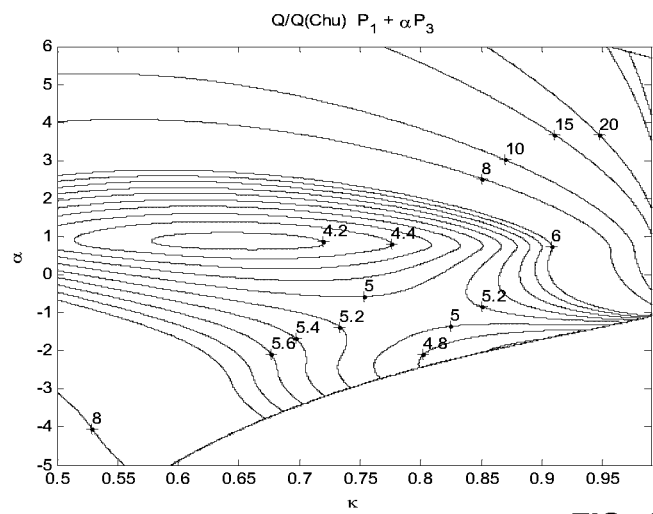
FIG. 10 is a graph of the $Q/Q_{Chu}$ ratio as a function of $\alpha$ and $\kappa$, for an exemplary $P_1+\alpha P_3$ charge antenna, according to an embodiment of this invention.
Figure 11:
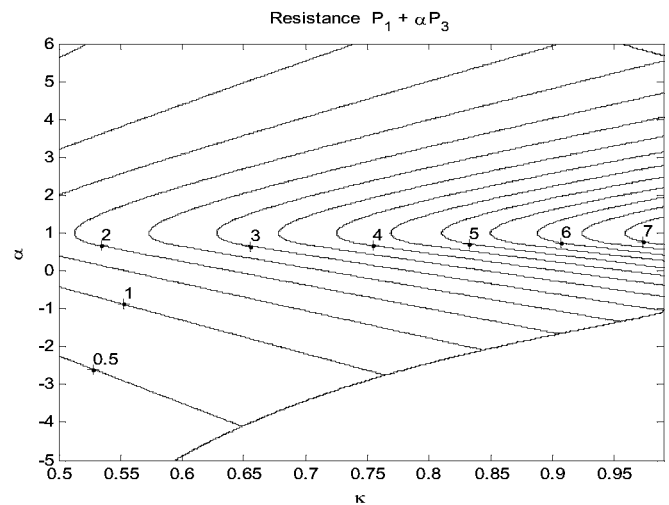
FIG. 11 is a graph of the resistance as a function of $\alpha$ and $\kappa$, for an exemplary $P_1+\alpha P_3$ charge antenna, according to an embodiment of this invention.
Figure 12:
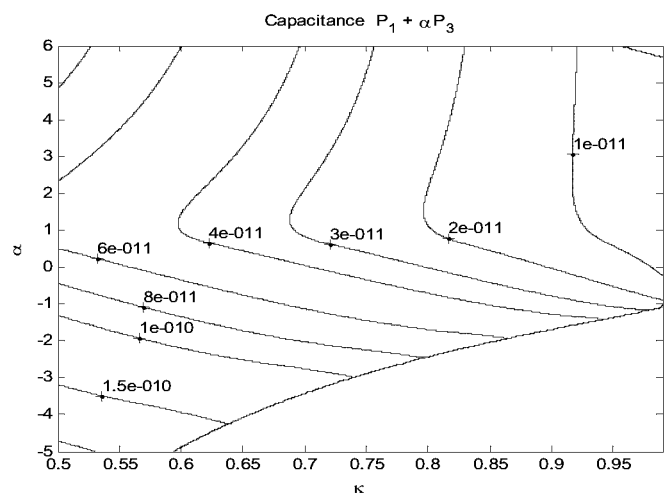
FIG. 12 is a graph of the capacitance as a function of $\alpha$ and $\kappa$, for an exemplary $P_1+\alpha P_3$ charge antenna, according to an embodiment of this invention.

Now with $$\Phi_{max} = \frac{2q}{\kappa h}(\Psi_1 + \alpha \Psi_3)$$

on the interval $\kappa h < z \leq 1$, this value must be larger than a calculated $\Phi_{max}$ on the surface of an enclosing sphere. In this situation, the equation for the capacitance and Q on the sphere cannot be written and, therefore, the problem must be numerically solved. FIG. 10 is a plot of the $Q/Q_{Chu}$ ratio as a function of the parameters $\kappa$ and $\alpha$. The upper boundary, in the right hand corner of FIG. 10, is caused by the potential becoming negative on the enclosing sphere which means the antenna is not inside the enclosing sphere. The lower boundary, in FIG. 10, is caused by the potential surface crossing the charge distribution at the top. When $\alpha = 0$, the Eq. 46 reduces to the previous solution for the sole $P_1$ charge distribution antenna, as is expected. At 50 MHz, the solution to Eq. 46 has two minimums: an absolute minimum at $Q = 28.706$ corresponding to $Q/Q_{Chu} = 4.1207$ at $\kappa = 0.6513$ and $\alpha = 0.8600$, with R=3.1939 and C=34.718 pF; and a local minimum at Q=31.879 corresponding to $Q/Q_{Chu}$=4.576 at κ=0.88, α=−1.835, with R=1.7737 and C=56.294 pF. These tabulations are shown in FIGS. 11-12. FIG. 11 is a plot of the resistance as a function of α and κ, for an exemplary $P_1+\alpha P_3$ charge antenna. And FIG. 12 is a plot of the capacitance as a function of α and κ, for an exemplary $P_1+\alpha P_3$ charge antenna. As can be seen from these FIGS., various Q solutions can be found.

Figure 13:
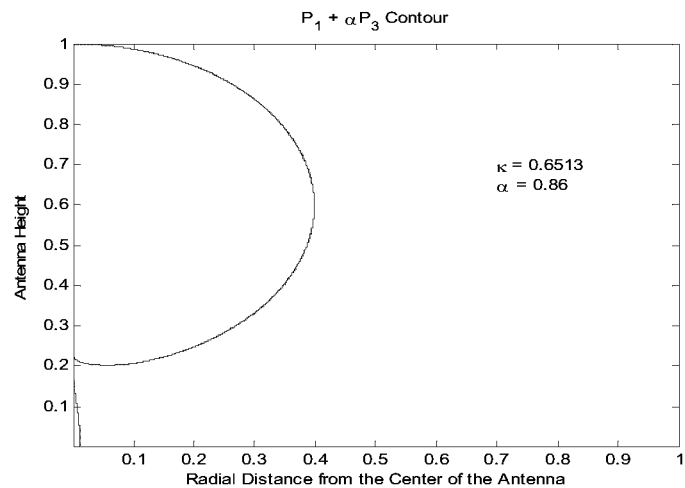
FIG. 13 is an illustration of the contour of an exemplary $P_1+\alpha P_3$ charge antenna, according to an embodiment of this invention.

FIG. 13 is an illustration of the contour of an exemplary $P_1+\alpha P_3$ charge antenna for a global minimum Q of 28.706, using an α value of 0.8600 and a κ value of 0.6513. This exemplary $P_1+\alpha P_3$ charge antenna is shaped similar to a volcano and smoke antenna and has a Q of 4.1027 times Chu's theoretical result. The antenna parameters for this design are $$Q = \frac{4.1207}{(kh)^3}$$

$$h_e = 0.53967h$$

$$R_r = 11.65(kh)^2$$

$$C = 6.943 * 10^{-11} h$$

The radiation resistance for this antenna is 35% higher than the single $P_1$ charge distribution antenna and Q is 12% lower. This is offset by 15% decrease in the capacitance of the antenna.

Figure 14:
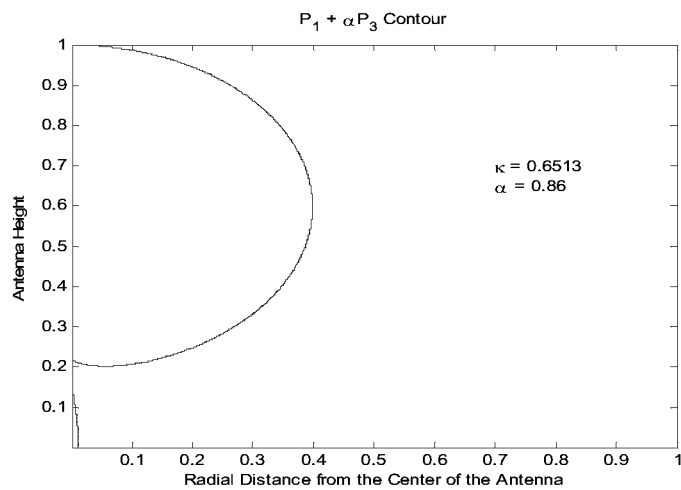
FIG. 14 is an illustration of the contour of an exemplary $P_1+\alpha P_3$ charge antenna, having the local minimum Q solution for $\alpha=-1.835$ and $\kappa=0.88$, according to an embodiment of this invention.

Of some interest is the shape of the local minimum Q solution. FIG. 14 illustrates the cross-sectional view of the of the local minimum solution Q=31.879 for an α value of −1.835 and a κ value of 0.88. It is worthy to note, for this exemplary $P_1+\alpha P_3$ charge antenna, the mathematical artifact of having a negative charge is seen in the closed cavity at the top of FIG. 14.

$P_0$ with Oblate Spheroid

From the above examples, it is apparent that the point charge at the end of constant line charge ($P_0$) antenna reduces the Q of the antenna. This point charge is equivalent to giving a spherical end cap to the $P_0$ charge distribution. However, in the above configurations, the top of the spherical volume was not filled by the antenna. If the spherical volume is filled by the antenna, then this will reduce the charge surface density, which is known to increase the capacitance, which would decrease Q.

However, a better choice for the end cap would be an oblate spheroid. The eccentricity can be continuously varied from 0, a sphere, to 1, a disk. It should be noted that this antenna is not the same as a disk loaded monopole, which is well known in the antenna community. In the disk loaded monopole the charge is on the bottom of the disk with minimal charge on the top surface. For the oblate spheroid loaded $P_0$ charge antenna, the oblate spheroid has equal charge on both upper and lower surfaces. When the image is added, the effective charge density on the top surface will be reduced and the effective charge density on the bottom surface will be increased.

The potential for an oblate spheroid with a charge q is derived with oblate spheroidal coordinates, the details being given in the appendix. The cylindrical coordinates can be expressed as oblate spheroid coordinates as $$z = a \sinh u \sin v$$

$$\rho = a \cosh u \cos v. \quad (47)$$

(Note: a parameterizes the eccentricity variable in the oblate spheroidal domain and α is the charge proportionality variable.) The inversion of the above equations from one domain to the other is given in the appendix. The potential can be expressed as a function of u only:

$$\Phi(u) = \frac{q}{4\pi\varepsilon_0}\left(\frac{\pi}{2} - \arctan(\sinh u)\right). \quad (48)$$

Using procedures similar to those discussed above, the potential field generated from a constant line charge terminated with an oblate spheroidal point charge is $$\Phi = \frac{(1-\alpha)q}{4\pi\varepsilon_0 \kappa h}\ln\left(\frac{(1+\tau_m)(1-\tau_i)}{(1-\tau_m)(1+\tau_i)}\right) + \frac{\alpha q}{4\pi\varepsilon_0}[\arctan(\sinh u_b) - \arctan(\sinh u_t)], \quad (49)$$

where the parameter a plays a role indirectly via u, and $u_t$ is for the top of the spheroid and $u_b$ is for the bottom of the spheroid in the spheroidal coordinate system.

Figure 15:
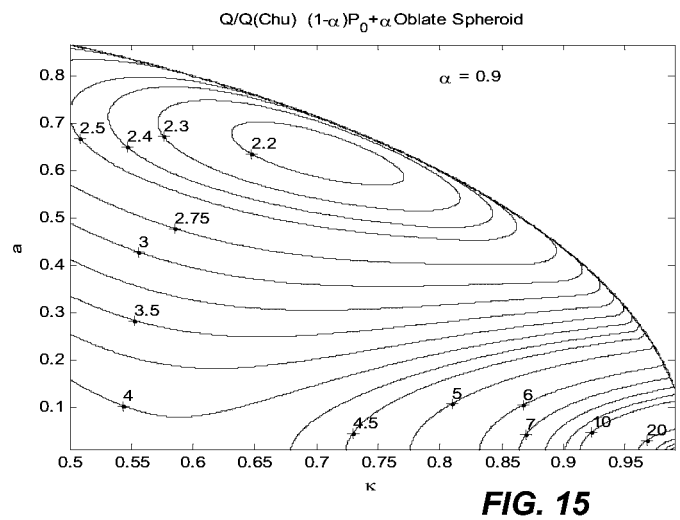
FIG. 15 is a graph of the $Q/Q_{Chu}$ ratio as a function of $\alpha$ and $\kappa$, for $\alpha=0.9$, for an exemplary $(1-\alpha)P_0+\alpha$ oblate spheroid charge antenna, according to an embodiment of this invention.

The maximum potential is not at the top of the oblate spheroid, thus Eq. 49 is numerically evaluated on the surface of the enclosing sphere of the antenna. FIG. 15 illustrates a graph of the values of $Q/Q_{Chu}$ as a function of α and κ, where α=0.9. For varying values of a, a unique solution can be found for Eq. 49. Each of these solutions can be optimized to result in a κ and α value. A tabulation of these values is shown in Table 3 below.

TABLE 3

| α | κ | a | Minimum Q | R | C |
|---|---|---|---|---|---|
| 0.5 | 0.691 | 0.722 | 19.421 | 2.94 | 55.7 pF |
| 0.6 | 0.6985 | 0.703 | 17.455 | 3.42 | 53.3 pF |
| 0.65 | 0.707 | 0.6905 | 16.786 | 3.73 | 50.9 pF |
| 0.675 | 0.706 | 0.671 | 16.523 | 3.83 | 50.3 pF |
| 0.7 | 0.709 | 0.6575 | 16.305 | 3.98 | 49.0 pF |
| 0.725 | 0.709 | 0.649 | 16.129 | 4.10 | 48.2 pF |
| 0.75 | 0.709 | 0.647 | 15.962 | 4.22 | 47.2 pF |
| 0.8 | 0.707 | 0.643 | 15.636 | 4.44 | 45.8 pF |
| 0.9 | 0.705 | 0.637 | 15.008 | 4.91 | 43.16 pF |
| 0.99 | 0.702 | 0.633 | 14.475 | 5.35 | 41.1 pF |

For the case of 90% of the charge on the surface of the oblate spheroid, the antenna parameters are $$Q = \frac{2.1544}{(kh)^3}$$

$$h_e = 0.670h$$

$$R_r = 17.9 * (kh)^2$$

$$C = 8.632 * 10^{-11} h$$

Figure 16:
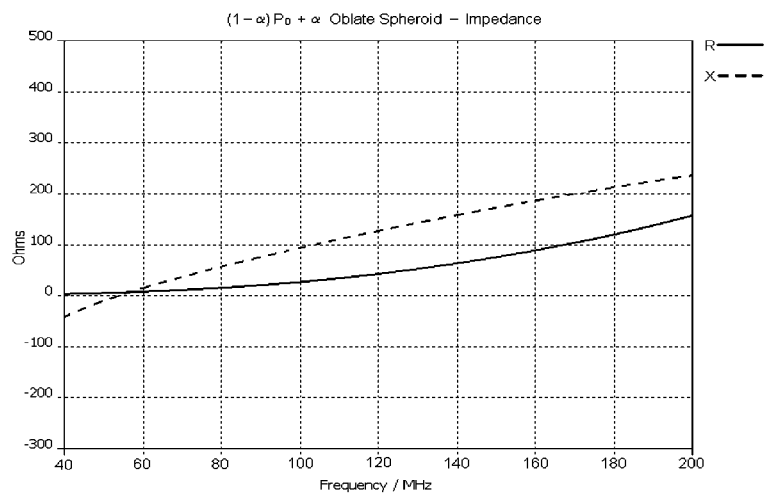
FIG. 16 is a graph of the impedance and resistance for an exemplary $(1-\alpha)P_0+\alpha$ oblate spheroid charge antenna, according to an embodiment of this invention.
Figure 17:
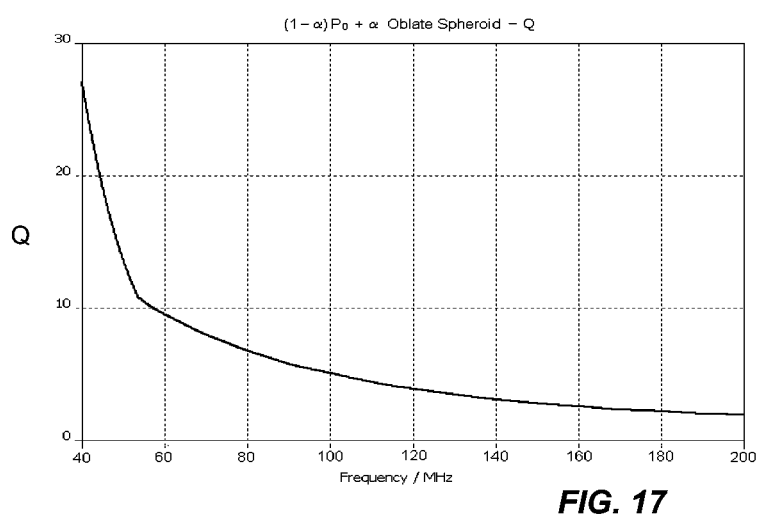
FIG. 17 is a graph of the Q behavior, for an exemplary $(1-\alpha)P_0+\alpha$ oblate spheroid charge antenna, according to an embodiment of this invention.
Figure 18:
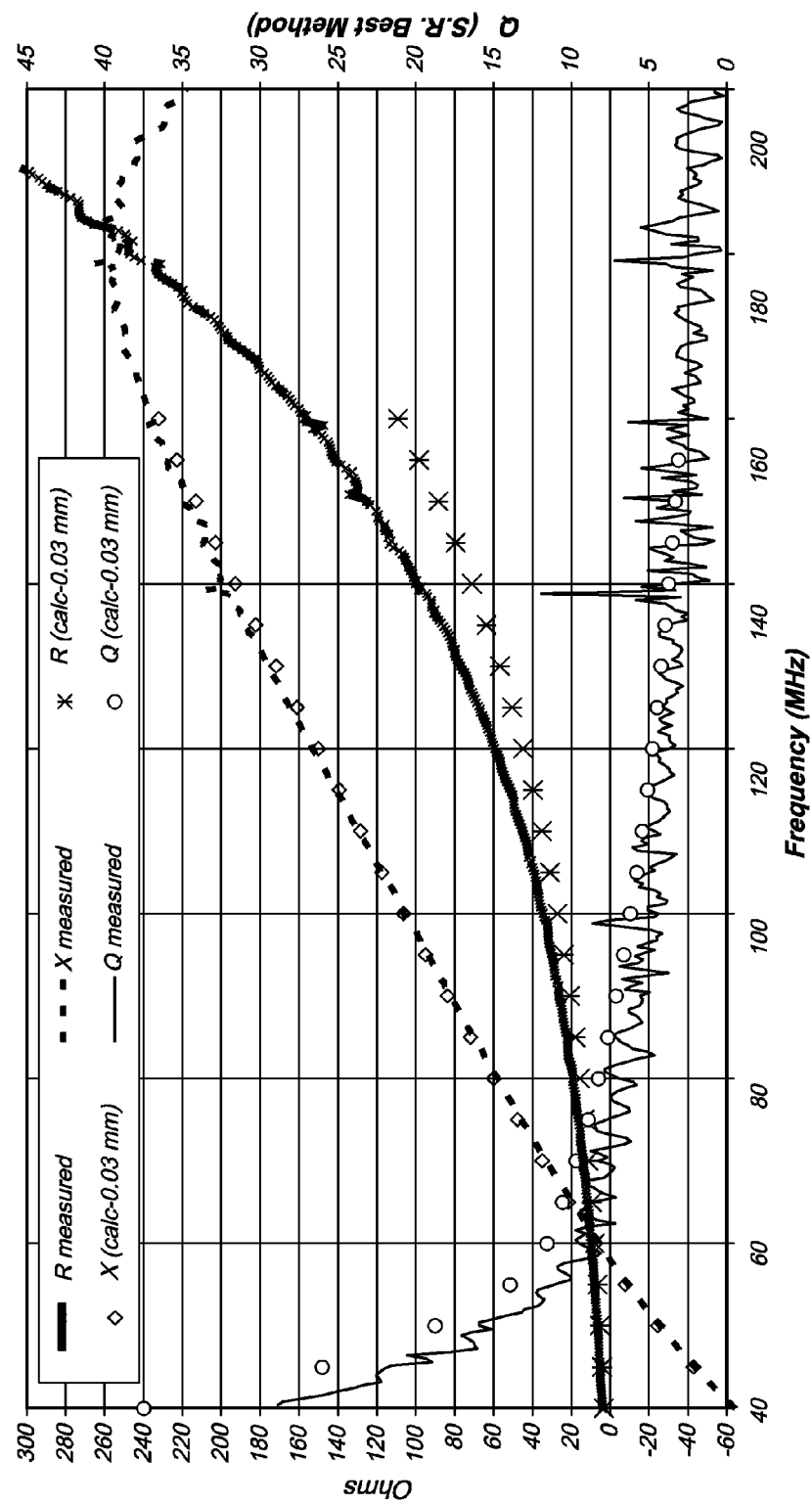
FIG. 18 is graph comparing measurements of an exemplary $(1-\alpha)P_0+\alpha$ oblate spheroid charge antenna, to numerically derived values, according to an embodiment of this invention.
Figure 19:
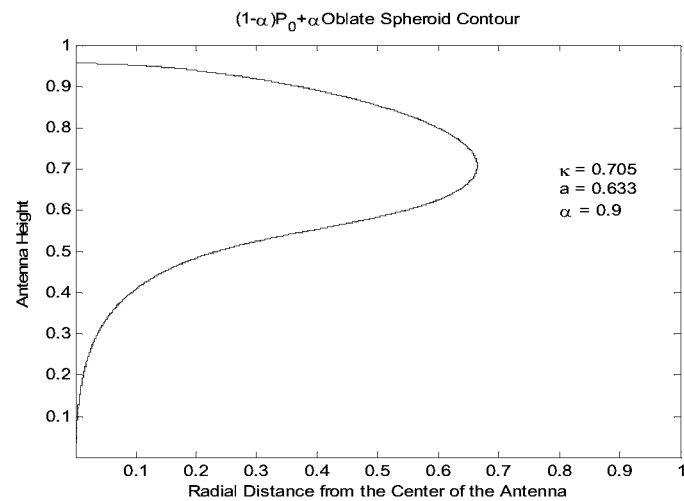
FIG. 19 is an illustration of the contour of an exemplary $(1-\alpha)P_0+\alpha$ oblate spheroid charge antenna, according to an embodiment of this invention.

The resulting Q is found to be almost half of the result for the "bulb" antenna, which utilized a constant line charge with a point charge termination (i.e., spherical end cap). The Q is 47% lower; R and C are 46% and 30% higher, respectively, than the bulb antenna. This exemplary $(1-\alpha)P_0+\alpha$ oblate spheroid charge antenna was numerical modeled using α=0.90. The exemplary numerical model was generated using a cylindrical antenna with a continuous surface and with a ½ half meter height. FIG. 16 is a graph of the impedance and resistance of the modeled antenna, as a function of frequency. FIG. 17 is a graph of the Q behavior, as a function of the frequency. Based on the results of these numerical models, an exemplary ½ meter antenna was physically built using 16 wires to approximate a solid surface. The exemplary antenna was evaluated over a frequency range from 40 MHz to over 200 MHz. The measurement results of the antenna demonstrated a very low Q and well behaved impedance profile. FIG. 18 is a plot of the comparison of the exemplary experimental model to the exemplary numerical models. FIG. 19 is an illustration of the contour for an exemplary $(1-\alpha)$ $P_0+\alpha$ oblate spheroid charge antenna.

$P_1$ with Oblate Spheroid

The same above exemplary technique can be expanded upon using a $P_1$ line charge instead of a $P_0$ line charge, with an oblate spheroid end charge. Using the $P_1$ line charge, the expression for the maximum potential field becomes $$\Phi\text{max(sphere)} = \frac{2(1-\alpha)qz}{4\pi\varepsilon_0(\kappa h)^2}\left(\ln\left(\frac{1+\tau}{1-\tau}\right) - 2\tau\right) + \frac{\alpha q}{4\pi\varepsilon_0}[\arctan(\sinh u_b) - \arctan(\sinh u_t)]. \tag{50}$$

The results of this procedure is shown in Table 4 below.

TABLE 4

| α | κ | a | Minimum Q | R | C |
|---|---|---|---|---|---|
| 0.5 | 0.6777 | 0.7217 | 18.95 | 3.50 | 48.0 pF |
| 0.6 | 0.6720 | 0.7270 | 17.14 | 3.72 | 49.9 pF |
| 0.61 | 0.6767 | 0.7362 | 16.80 | 3.80 | 49.86 pF |
| 0.62 | 0.6772 | 0.7349 | 16.64 | 3.84 | 49.87 pF |
| 0.7 | 0.7000 | 0.7000 | 15.60 | 4.35 | 46.9 pF |
| 0.8 | 0.7049 | 0.6516 | 14.95 | 4.75 | 44.9 pF |
| 0.9 | 0.7026 | 0.6394 | 14.69 | 5.06 | 42.8 pF |
| 0.99 | 0.6990 | 0.636 | 14.45 | 5.32 | 41.4 pF |

Using a 90% charge on the oblate spheroid, the antenna parameters become $$Q = \frac{2.109}{(\kappa h)^3}$$

$$h_e = 0.6792h$$

$$R_r = 18.46 * (\kappa h)^2$$

$$C = 8.56 * 10^{-11} h.$$

$h_e = 0.6792h.$ $R_r = 18.46*(\kappa h)^2$ $C = 8.56*10^{-11} h$

Figure 20:
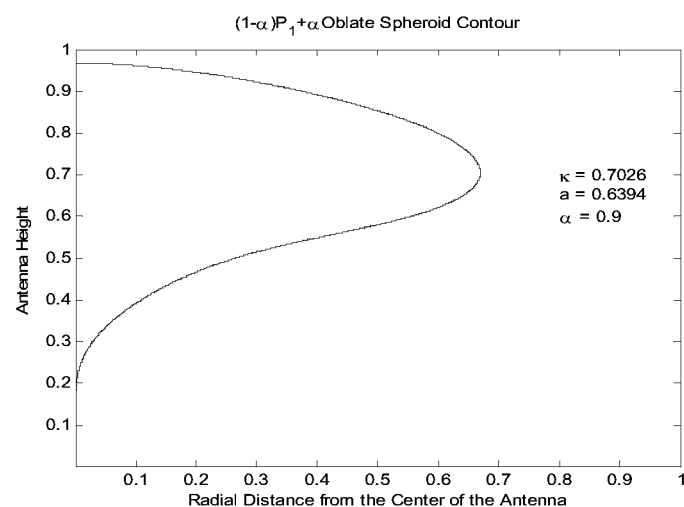
FIG. 20 is an illustration of the contour of an exemplary $(1-\alpha)P_1+\alpha$ oblate spheroid charge antenna, according to an embodiment of this invention.

For h=½ m and 50 MHz, with $\alpha$=0.9, the minimum Q=14.69 which is 2.109 times Chu's theoretical result. FIG. 20 illustrates a cross-sectional view of an exemplary $(1-\alpha)$ $P_1+\alpha$ oblate spheroid charge antenna, using the parameters designed above.

$P_0$ with Oblate Spheroid and $2^{nd}$ Harmonic on Oblate Spheroid

The oblate spheroid solution can be further improved by redistributing the charge to modify the potential curves and therefore the shape of the surface. This can be calculated by solving the scalar potential equations for the oblate coordinate system. The scalar potential equation in this coordinate system can be expressed as $$\Phi(u, v) = \sum_{n=0}^{\infty} a_n K_n(iu) P_n(v), \tag{51}$$

where $P_n$ are Legendre polynomials, $i=\sqrt{-1}$, and the $K_n(iu)$ terms are the far-field dependence functions. Eq. 51 can be tackled using separation of variables in the oblate coordinate system with the solutions for the u dependence obtained from Arfkin's classic text—"Numerical Methods for Physicists," $2^{nd}$ Edition, Academic Press, Ohio, 1970. Eq. 51 with $K_0$(iu), $P_0$(v) was used in the oblate spheroidal calculation. The second term $K_1(iu)P_1(v)$ is an odd function and would change the shape of the oblate spheroid in a non-symmetric manner so that the assumption about the effective height would not be valid. Therefore, it is not used. The third term $K_2(iu)P_2(v)$ is symmetric which makes it suitable for our purposes. In Eq. 51, these first and third terms will be used to modify the oblate spheroid's shape. For reference, the first few values of K are $K_0(iu)=i \text{ arccot}(u)$ $K_1(iu)=u \text{ arccot}(u)-1.$ $$K_2(iu) = i\frac{1}{2}(3u^2+1)\text{arccot}(u) - i\frac{3}{2}u$$

The general form of these terms being $$K_n(iu) = \tag{52}$$
$$-iP_n(iu)\arccos(u) - \frac{2n-1}{n}P_{n-1}(iu) - \frac{(2n-5)}{3(n-1)}P_{n-3}(iu) -- \ldots,$$

where $P_n$ are Legendre polynomials and the sum terminates at the first singular term. For simplicity only the $P_0(v)$ and $P_2(v)$ polynomials were used as they redistribute the charges equally on both sides of the oblate spheroid. None of the high order $P_n(v)$, n≠0 polynomials change the net charge on the oblate spheroid. Based on this decomposition, the potential field expression becomes $$\Phi_{Ob2} = \frac{(1-\alpha)q}{4\pi\varepsilon_0\kappa h}\ln\left(\frac{(1+\tau_m)(1-\tau_i)}{(1-\tau_m)(1+\tau_i)}\right) + \tag{53}$$
$$\frac{\alpha q}{4\pi\varepsilon_0}[\arctan(\sinh u_b) - \arctan(\sinh u_t)] +$$
$$\frac{\beta q}{4\pi\varepsilon_0}\left[\left((3u_t^2+1)\text{arccot}(u_t) - \frac{3}{2}u_t\right)P_2(v_t) - \right.$$
$$\left.\left((3u_b^2+1)\text{arccot}(u_b) + \frac{3}{2}u_b\right)P_2(v_b)\right],$$

where $\beta$ represents the coefficient for the $P_2$ polynomial, $v_t$ is for the top oblate spheroid and $v_b$ is for the bottom oblate spheroid.

The effective height becomes $h_{eff}=(1-\alpha)\kappa h/2+\alpha\kappa h$ and the radiation resistance is $R_r=10[\kappa h\kappa(1+\alpha)]^2$. Using procedures previously described, Q is numerically calculated. It is noted that the addition of the second order term $P_2$ modifies the source charge on the oblate spheroid to where it could be negative at the center of the oblate spheroid or at the edge of the oblate spheroid. A program verified that an equipotential surface encloses all the charge in two areas: at ρ=0 on z axis and at edge of the oblate spheroid.

Figure 21:
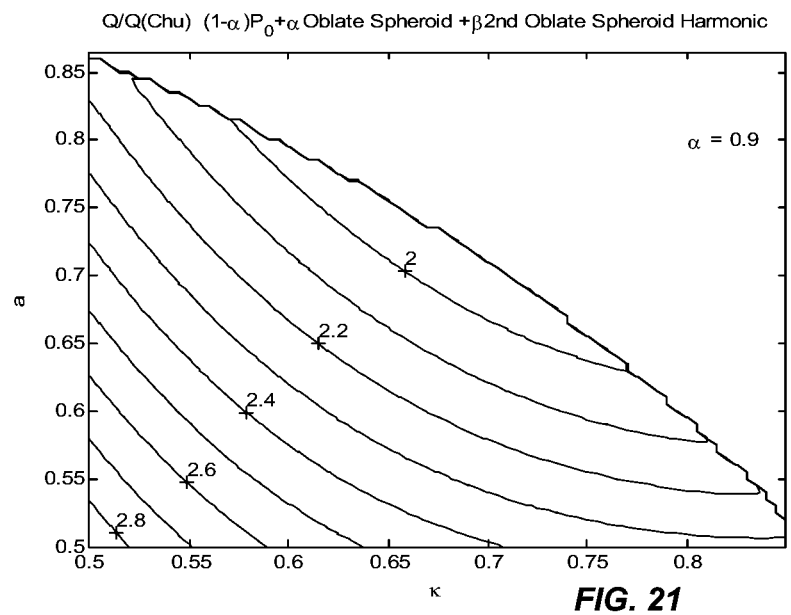
FIG. 21 is a graph of the $Q/Q_{Chu}$ ratio for an exemplary $(1-\alpha)P_0+\alpha$ oblate spheroid+$\beta$ $2^{nd}$ harmonic oblate spheroid charge antenna, according to an embodiment of this invention.

From the above derivations, the $Q/Q_{Chu}$ ratio is a function of κ, α, β, and a is plotted in FIG. 21. The parameter β is calculated to obtain the minimum value of Q. From FIG. 21, the minimum Q is found at κ=0.679, a=0.734, and β=−0.321 for a 90% charge distribution on the oblate spheroid. At 50 MHz, the absolute values of the antenna at this minimum is Q=13.311, R=4.563, and C=52.41 pF. The resulting antenna parameters, as a function of k and h become $$Q = \frac{1.9107}{(kh)^3}$$

$$h_e = 0.64505h$$

$$R_r = 16.644*(kh)^2$$

$$C = 1.0482*10^{-10}h.$$

$h_e$=0.64505h.

$R_r$=16.644*$(kh)^2$

C=1.0482*$10^{-10}$h

Figure 22:
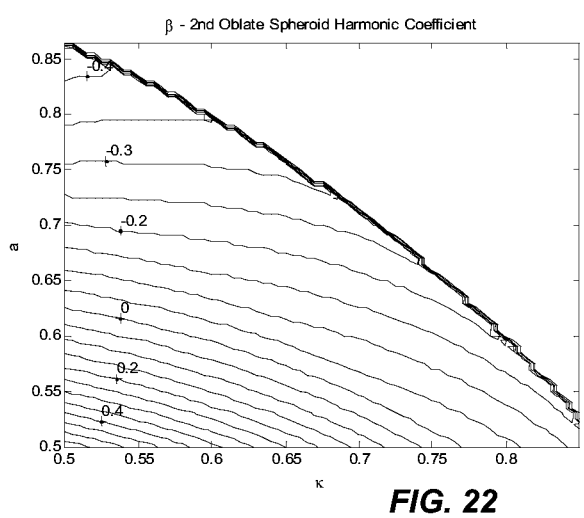
FIG. 22 is a graph of the β distribution as a function of κ and α, for a minimum Q for an exemplary $(1-α)P_0+α$ oblate spheroid+β $2^{nd}$ harmonic oblate spheroid charge antenna, according to an embodiment of this invention.
Figure 23:
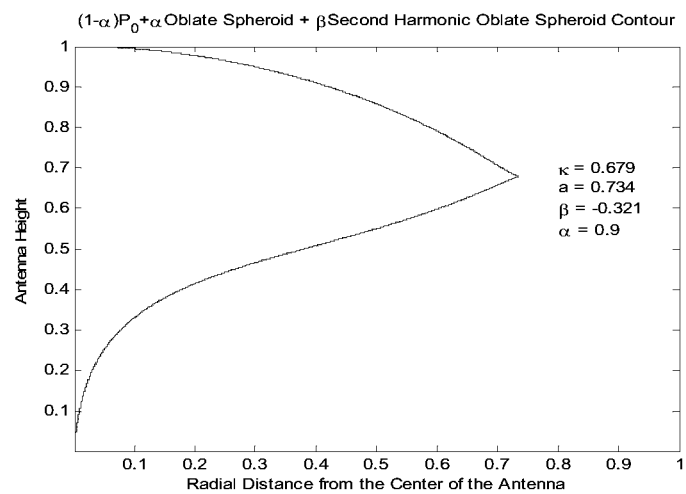
FIG. 23 is an illustration of the contour of an exemplary $(1-α)P_0+α$ oblate spheroid+β $2^{nd}$ harmonic oblate spheroid charge antenna, according to an embodiment of this invention.

FIG. 22 is a plot of the β distribution as a function of κ and a for a minimum Q. FIG. 23 demonstrates the cross-sectional shape of the exemplary (1−α) $P_0$+α oblate spheroid+β second harmonic on oblate spheroid charge antenna. It is interesting to note that the shape of this antenna is practically mushroom-like.

Non-Spherical Enclosing Volume

Figure 24:
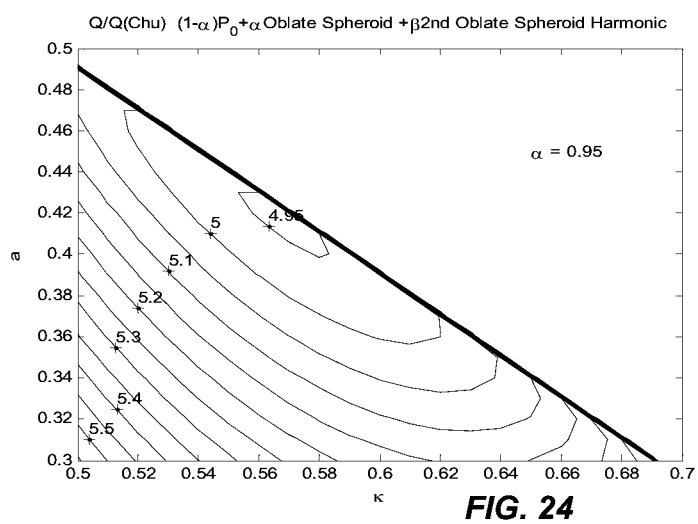
FIG. 24 is a graph of the $Q/Q_{Chu}$ ratio as a function of α and κ, for an exemplary $(1-α)P_0+α$ oblate spheroid+β $2^{nd}$ harmonic oblate spheroid charge antenna, according to an embodiment of this invention.
Figure 25:
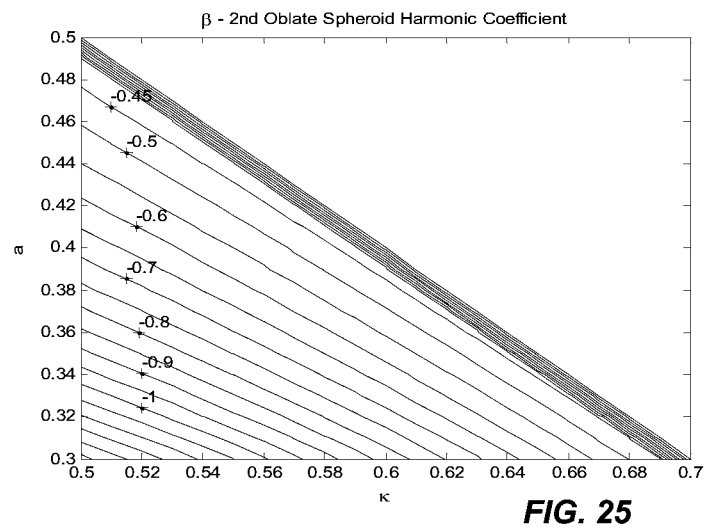
FIG. 25 is a graph of the β distribution as a function of κ and α, for a minimum Q for an exemplary $(1-α)P_0+α$ oblate spheroid+β $2^{nd}$ harmonic oblate spheroid charge antenna, according to an embodiment of this invention.
Figure 26:
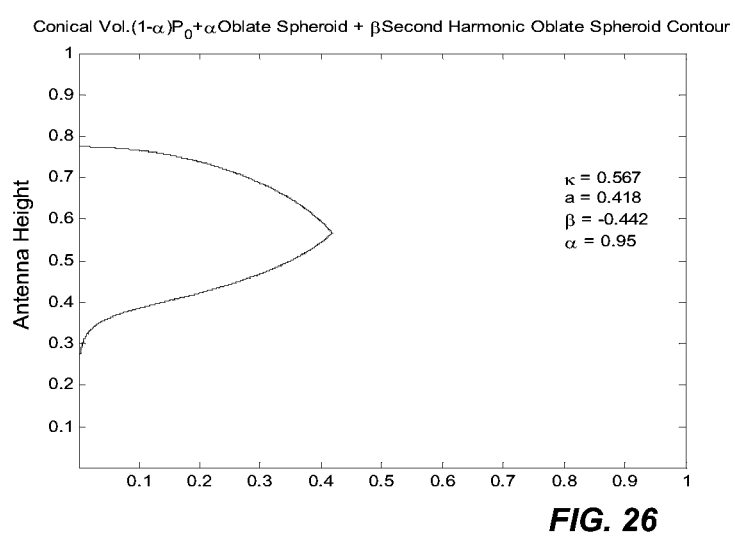
FIG. 26 is an illustration of the contour of an exemplary conical enclosing volume $(1-α)P_0+α$ oblate spheroid+β $2^{nd}$ harmonic oblate spheroid charge antenna, according to an embodiment of this invention.

Using the previous example, the exemplary (1−α)$P_0$+α oblate spheroid+β second harmonic on oblate spheroid charge antenna was constrained to fit within an inverted 45° cone where the angle is measured with respect to the vertical. Mathematically, this is expressed as ρ=1−z. The capacitance is calculated from the largest value of the potential on this cone. It should be noted, however, any enclosing surface may be used to arrive at a correct solution, therefore an appropriate solution is not limited to the use of 45° or a cone, but is used here as just one example of many approaches that may be used. Using the inverted 45° cone, for example, a plot was generated of the $Q/Q_{Chu}$ ratio as a function of κ, α, β, and a as shown in FIG. 24. The parameter β is calculated to obtain the minimum value of Q. The conical volume is much small than the spherical volume and therefore the Q is understood to be much larger. Using higher resolution parameter steps of 0.001, the antenna parameters were recalculated resulting in Q=34.437 at 50 MHz, $Q/Q_{Chu}$=4.9433, R=3.3514, C=27.58 pF for κ=0.567, a=0.418, β=−0.442 with 95% of the charge on the top load. The numerical noise at this resolution is about ±0.0005 for the value of $Q/Q_{Chu}$. The top load parameter α was used to modify the antenna shape to fit our geometric constraints. As can be seen from the above results, the Q value is significantly less than the first ACD antenna's Q value. FIG. 25 is a plot of the β distribution as a function of κ and a for a minimum Q. FIG. 26 is an illustration of the contour of an exemplary conical enclosing volume (1−α)$P_0$+α oblate spheroid+β second harmonic on oblate spheroid charge antenna.

Figure 27:
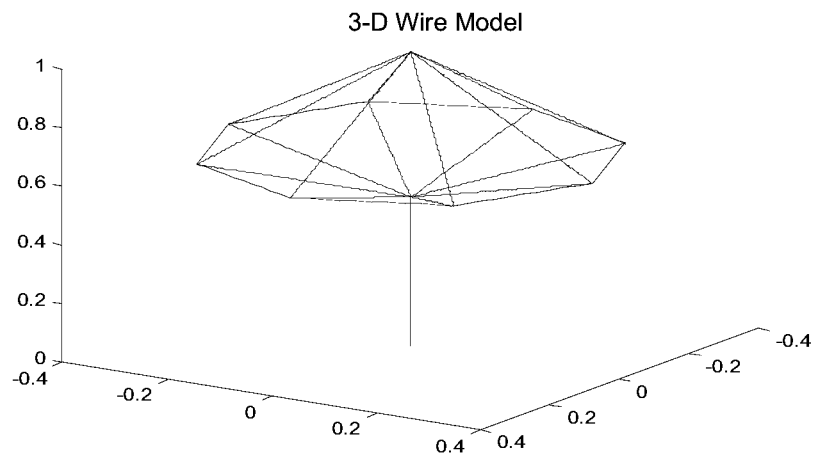
FIG. 27 is a 3-D rendering of a wire model of an exemplary $(1-α)P_0+α$ oblate spheroid+β $2^{nd}$ harmonic oblate spheroid charge antenna, according to an embodiment of this invention.

A model of this antenna can be generated by using wire approximations. In general, this antenna can be approximated using 45° wires for the top portion with a wire tangential to the bottom surface of the antenna. Eight sets of wires can be used to approximate this antenna, with horizontal wires to connect the appropriate vertices. FIG. 27 is a 3-D rendering of a wire model of an exemplary 45 degree (1−α) $P_0$+α oblate spheroid+β second harmonic on oblate spheroid charge antenna. Though this antenna initially appears similar to prior art antennas, the subtle differences in its shape provides a superior performance.

Vertical Dipole

In the above examples, the antennas under study were principally monopole antennas of one form or another. In this embodiment, a dipole antenna is discussed. Of particular concern in electrical small antenna design is the loss caused by ground currents, which is often exacerbated in the case of a monopole antenna. The use of a dipole antenna reduces ground currents. The potential field for a dipole is calculated in principally the same manner as in the monopole case. The dipole is centered at z=h/2 and the image dipole is centered at z=−h/2. The length of the antenna arm is L=κh/2.

The calculation can be divided into two parts. The first part is with the dipole in free space, and the second part is with the image dipole. The top arm of the dipole is excited at a voltage. The other arm of the dipole is excited with the ground of the coaxial cable. The general potential field equation for such a structure is $$\Phi(\rho, z) = \frac{q}{4\pi\varepsilon_0 L}\ln\left(\frac{1+\tau}{1-\tau}\right), \quad (54)$$

For the free space dipole, the potential field is $$\Phi(\rho, z) = \frac{2q}{4\pi\varepsilon_0 \kappa h}\ln\left(\frac{(1+\tau_t)(1-\tau_b)}{(1-\tau_t)(1+\tau_b)}\right), \quad (55)$$

where $$\tau_t = \frac{\kappa h/2}{R_f + R_t}$$

is for the monopole, $$\tau_b = \frac{\kappa h/2}{R_f + R_b}$$

is for the image monopole, $R_t=\sqrt{(z-\kappa h/2-h/2)^2+\rho^2}$ is the distance from ρ,z to the top of the monopole, $R_f=\sqrt{(z-h/2)^2+\rho^2}$ is the distance from ρ,z to the feed point and $R_b=\sqrt{(z-h/2+\kappa h/2)^2+\rho^2}$ is the distance from ρ,z to the bottom of the dipole. The capacitance is computed by calculating the potential or voltage at ρ=0 and z=h. The above equations simplify to $R_t$=(z−h/2−κh/2), $R_f$=z−h/2, $R_b$=(z−h/2+κh/2), $$\tau_m = \frac{\kappa h/2}{2z - h - \kappa h/2},$$

and $$\tau_i = \frac{\kappa h/2}{2z - h + \kappa h/2}$$

for z≥κh, resulting in $$\Phi(0, z) = \frac{2q}{4\pi\varepsilon_0 \kappa h} \ln\left(\frac{(2z-h)^2}{(2z-h-\kappa h)(2z-h+\kappa h)}\right). \quad (56)$$

Eq. 57 can be further simplified to yield $$\Phi(0, h) = \frac{2q}{4\pi\varepsilon_0 \kappa h} \ln\left(\frac{1}{(1-\kappa^2)}\right). \quad (57)$$

For the image dipole $$\tau_{ti} = \frac{\kappa h/2}{R_f + R_t}$$

is for the monopole, $$\tau_{bi} = \frac{\kappa h/2}{R_f + R_b}$$

is for the image dipole,
$R_t = \sqrt{(z-\kappa h/2+h/2)^2+\rho^2}$ is the distance from ρ,z to the top of the image dipole,
$R_f = \sqrt{(z+h/2)^2+\rho^2}$ is the distance from ρ,z to the feed point of the image and
$R_b = \sqrt{(z+h/2+\kappa h/2)^2+\rho^2}$ is the distance from ρ,z to the bottom of the image dipole. The capacitance is computed by calculating the potential or voltage at ρ=0 and z=h. The above equations simplify to $R_{ti}=(z+h/2-\kappa h/2)$, $R_{fi}=z+h/2$, $R_{bi}=(z+h/2+\kappa h/2)$, $$\tau_{ti} = \frac{\kappa h/2}{2z + h - \kappa h/2},$$

and $$\tau_{bi} = \frac{\kappa h/2}{2z + h + \kappa h/2}$$

for z≥κh. The resulting expression for the potential field for the image dipole becomes $$\Phi(0, z) = \frac{2q}{4\pi\varepsilon_0 \kappa h} \ln\left(\frac{(2z+h)^2}{(2z+h-\kappa h)(2z+h+\kappa h)}\right), \quad (58)$$

which can be further simplified to $$\Phi(0, h) = \frac{2q}{4\pi\varepsilon_0 \kappa h} \ln\left(\frac{9}{(9-\kappa^2)}\right). \quad (59)$$

The combined potential from Eqs. 57 and 59 is $$\Phi(0, h) = \frac{2q}{4\pi\varepsilon_0 \kappa h} \ln\left(\frac{1}{1-\kappa^2} \frac{9}{9-\kappa^2}\right). \quad (60)$$

The capacitance become $$C(\kappa) = \frac{4\pi\varepsilon_0 \kappa h}{-2\ln((1-\kappa^2)(1-\kappa^2/9))}. \quad (61)$$

And the equation for radiation resistance becomes $$R_r = 40k^2 \left[\frac{\int_0^h zq(x)\,d^3x}{\int_{fp}^h q(x)\,d^3x}\right]^2, \quad (62)$$

where q(z) is $$\begin{aligned}
q(z) &= 0 \text{ for } 0 \le z < \frac{1-\kappa}{2}h \\
q(z) &= -2q_0/\kappa h \text{ for } \frac{1-\kappa}{2}h \le z < \frac{h}{2} \\
q(z) &= 2q_0/\kappa h \text{ for } \frac{h}{2} \le z \le \frac{1+\kappa}{2}h \\
q(z) &= 0 \text{ for } \frac{1+\kappa}{2}h < z \le g.
\end{aligned} \quad (63)$$

Using a change in variables, $$z = x + \frac{h}{2},$$

and performing Me following steps:

$$\int_0^h zq(z)\,dz = \int_0^{\kappa h/2} 2q_0/\kappa h\left(\frac{h}{2}+x\right)dx - \int_{\kappa h/2}^0 2q_0/\kappa h\left(\frac{h}{2}+x\right)dx$$

$$\int_0^h zq(z)\,dz = 2q_0/\kappa h\left(\left[\frac{hx}{2}+\frac{x^2}{2}\right]_0^{\kappa h/2} - \left[\frac{hx}{2}+\frac{x^2}{2}\right]_{-\kappa h/2}^0\right)$$

$$\int_0^h zq(z)\,dz = 2q_0/\kappa h\left(\left[\frac{\kappa h^2}{4}+\frac{(\kappa h)^2}{8}\right] + \left[-\frac{\kappa h^2}{4}+\frac{(\kappa h)^2}{8}\right]\right)$$

$\int_0^h zq(z)dz = q_0\kappa h/2$ $\int_{fp}^h q(z)dz = \int_0^{\kappa h/2} 2q_0/\kappa h\,dx = q_0,$ results in Eq. 62 becoming $$R_e = 40\left(\frac{\kappa hk}{2}\right)^2. \quad (64)$$

From the derivations shown above, the Q is found to be $$Q = \frac{-12\ln((1-\kappa^2)(1-\kappa^2/9))}{(\kappa hk)^3}. \quad (65)$$

Figure 28:
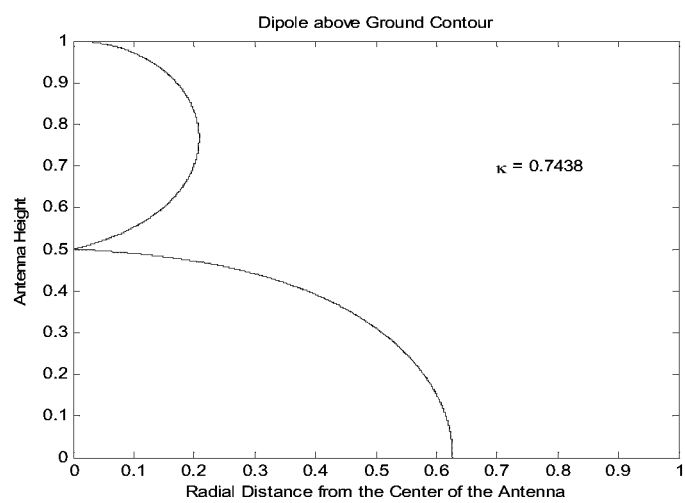
FIG. 28 is an illustration of the contour of an exemplary dipole antenna, according to an embodiment of this invention.

The minimum value of Q is at $\kappa=0.7437706$. The resulting other antenna parameter values become $Q=12.67326/ka^3$ $h_{eff}=0.37188*h$ $R_r=5.53190(ka)^2$ $C=4.75458*10^{-11}*h$ Based on the above values, an exemplary dipole antenna having a minimum Q was designed. FIG. 28 is a illustration of the contour of an exemplary dipole, using the above parameters. It should be noted that the geometry of this exemplary dipole antenna approximates that of a prolate spheroid centered above the hemisphere of an oblate spheroid.

It should also be noted that, generally speaking, a cylindrically symmetric enclosing volume is the simplest case for monopole or linear-type antennas. However, as alluded above, the enclosing volume can be of very general shapes, in addition to a cylindrically symmetric volume. For example, a rectangular enclosing volume could be used. Various harmonic or non-harmonic basis functions could be used for the top-load. Complex line charge distributions could be used as elements.

Accordingly, by choosing a different enclosing volume shape, and tailoring basis functions to match that shape, it is possible to design a "flatter" antenna with a low Q. Flat antennas are of particular interest in the field of printed circuit card antennas or conformal antennas. For example, a possible design approach for a printed circuit card antenna is to project a three dimensional cylindrically symmetric antenna to a two dimensional antenna. (The two dimensional antenna is a slice of the three dimensional cylindrically symmetric antenna that includes the axis of rotation of the three dimensional cylindrically symmetric antenna.) Now, a spherical monopole becomes a disk monopole, as a gross approximation.

It should be also understood that a low Q, flatter antenna will have most of the charge on its edge. If one slices the flatter antenna to include the largest area, this will better approximate a printed circuit card antenna. The approach could improve the performance of the wire antenna, which was discussed above. The antenna could be any size and mounted on any object.

Figure 29:
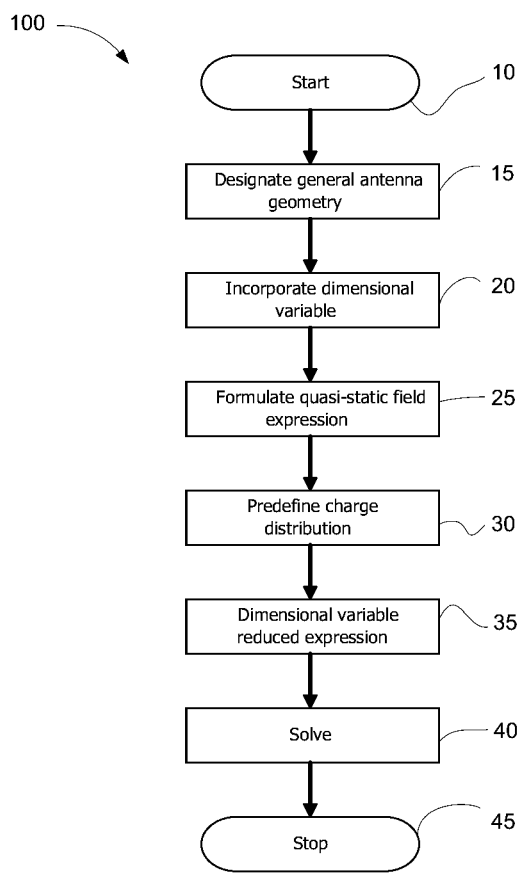
FIG. 29 is a flow chart illustrating an exemplary process, according to an embodiment of this invention.
Figure 30:
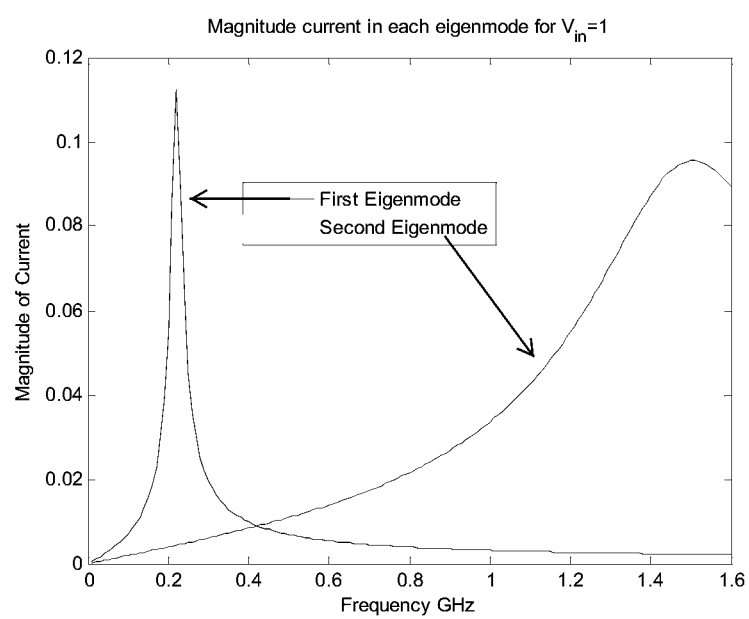
FIG. 30 shows a plot of two eigenmodes.
Figure 31:
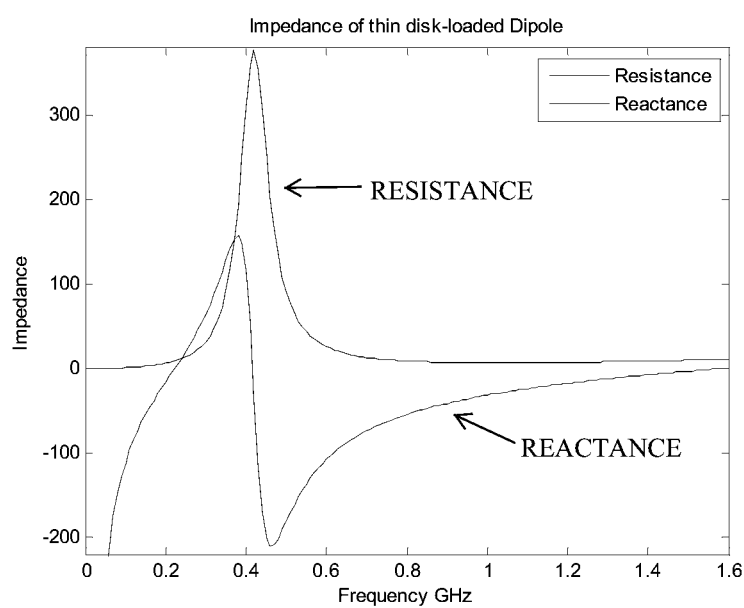
FIG. 31 shows a plot of resistance and reactance.

FIG. 29 is a flow chart illustrating an exemplary process in accordance with an embodiment of this invention. The exemplary process 100 of FIG. 29 enables one of ordinary skill in the art to design electrically small antennas to have a desired Q as a function of a dimensional variable. By evaluating the Q as a function of the dimensional variable, the electrical parameters and contour(s) of a desired Q factor antenna can be designed. Judicially selecting the dimensional variable's value, antennas of varying Q's can be designed. In addition, by minimizing the Q-dimensional variable relationship, a minimum Q antenna can be arrived at.

The exemplary process 100 begins 10 with designation of an electrically small antenna geometry 15 or a form factor corresponding to the antenna geometry 15. This designation is of general form and may simply be the establishment of a coordinate system that is consistent with the geometry chosen. Based on the type of antenna geometry 15 or form factor chosen, the exemplary process 100 incorporates a suitable dimensional variable 20 or a form factor related parameter. It is not necessary that the dimensional variable 20 or form factor related parameter be of a form that is consistent with the geometry's coordinate system, however, it would be preferred as this would obviate the need for a dimensional transformation. Proceeding from the dimensional variable 20 incorporation, the exemplary process 100 formulates quasi-static field equations 25. The quasi-static field equations 25 entail the application of Maxwell's formulas to result in a potential or scalar field equation(s) that relates the field intensities at field point(s) as a function of the source charge distribution.

Next, from the quasi-static field equation formulation 25 (and if the charge distribution is not already included), the exemplary process 100 impresses a given charge distribution 30 within the quasi-static field equation formulation 25. The given charge distribution 30 may be a single "type" charge distribution or of multiple "types" such as from differing basis functions. The charge distribution 30 may be different for different parts of the antenna geometry 15.

It should be appreciated that depending on the complexity of the charge distribution 30 and the quasi-static field formulation 25, the order of the exemplary process 100 for these respective steps may be reversed, without departing from the spirit and scope of this invention. Accordingly, the exemplary process 100 may first impress a given charge distribution 30 in accordance with the antenna geometry 15 or form factor chosen, and then proceed to generate the quasi-static field equations 25, without loss of generality. Presuming that the charge distribution 30 is performed subsequent to the quasi-static field equation formulation 25, the exemplary process 100 proceeds onto a dimensional variable-reduced expression 35 of the quasi-static field equation formulation 25. The dimensional variable-reduced expression 35 may simply be a reduced algebraic expression or a form that relates the Q of the antenna geometry in terms of the dimensional variable (form factor related parameter) or may take the form of another antenna parameter, such as the capacitance, for example. The capacitance is expressible in terms of the charge distribution and the dimensional variable (form factor related parameter). If expressed in terms of the capacitance, this dimensional variable-reduced expression 35 can be used to generate a Q expression, by appropriate use of a corresponding radiation resistance calculation.

The Q expression can then be solved 40 using a minimization and/or numerical technique to find a minimum Q or dimensional variable-to-Q correspondence. A plot of the computed capacitance and radiation resistance can be generated to correlate to given or desired Q values. By evaluating Q, the capacitance, the radiation resistance, and selecting the appropriate dimensional value (form factor relater parameter), design decisions can be made to meet the performance requirements of an antenna. The solved equation 40 will provide a value(s) of the dimensional variable that generally operate to define the Q and geometry of a corresponding antenna. The exemplary process 100 then terminates at 45. The results of this exemplary process 100 can then be used to physically build or model an antenna that demonstrates the Q performance chosen.

Now that the details of the above cross-referenced application have been shown and described, the details of an analytic antenna design for a dipole antenna by eliminating or reducing antenna pattern nulls and impedance anti-resonances of the present invention will now be described and shown.

Existing antenna designs typically have anti-resonances in the impedance and nulls in the radiation pattern. An objective is to eliminate (or move to a higher frequency) one or more of the anti-resonances in the impedance and one or more of the nulls in the radiation pattern. The radiation pattern would be a dipole pattern over an extended frequency range. The performance of the algorithm should extend beyond a one wavelength high monopole antennas and potentially extends to ultra wide bandwidth antennas. The cross-referenced patent application entitled "Quasi-Static Design Approach For Low Q Factor Electrically Small Antennas", or more simply "Quasi-static antenna design algorithm", can be utilized to perform the designs. The algorithm will calculate the quasi-static Q, radiation resistance and capacitance. This design will not require added resistance to create wide bandwidth antennas.

Howard Stuart shows that the DC capacitance is the sum of the effective capacitances of the eigenmodes of the antenna. It is believed that each eigenmode is uniquely linked to the electrostatic spherical harmonic. The eigenmodes are analogous to resonant modes in a radio frequency cavity that decay via resistive loss in the conducing walls. The antenna eigenmodes decay via radiation loss. The ideal antenna would have a high radiation loss or a small Q for each eigenmode. Each eigenmode has a unique radiation pattern; the first eigenmode is a dipole radiation pattern. The higher order eigenmodes are odd vector spherical harmonics.

The impedance of each eigenmode is equivalent to a series LC with a resistor across the inductor. The antenna impedance is a parallel combination of all of the eigenmode equivalent circuits. Stuart pointed out that the DC capacitance was a sum of the effective capacitances from each eigenmode (At DC, the inductors short the resistors.). Stuart modeled the second eigenmode as a capacitance and neglected the higher order eigenmodes. Data for the second eigenmode was selected to illustrate the concept. The higher order eigenmode were neglected. Table I shows the combined data for a disk loaded monopole.

Figure 32:
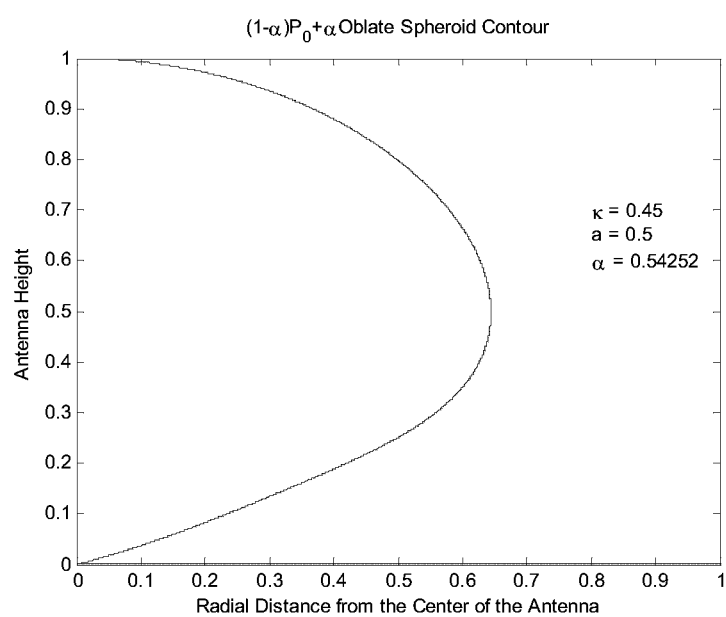
FIG. 32 shows a plot of radial distance from the center of the antenna.

The radiation pattern at any given frequency is a linear combination of the eigenmode radiation patterns weighted with the current flow in each mode. FIG. 32 shows the magnitude of the current flow $$|I_1| = \frac{V_0}{|Z_1|} \text{ and } |I_2| = \frac{V_0}{|Z_2|}$$

for eigenmode 1 and 2, respectively. The impedance for eigenmode 1 is $$Z_1 = -\frac{j}{\omega C_1} + \frac{j\omega L_1 R_1}{j\omega L_1 + R_1}$$

where the values of $C_1$=8.88 pF, $R_1$=738.7 and $L_1$=58.7 nH.

$$Z_1 = -\frac{j}{\omega C_1} + \frac{j\omega L_1 R_1}{j\omega L_1 + R_1} \frac{-j\omega L_1 + R_1}{-j\omega L_1 + R_1} = \frac{\omega^2 L_1^2 R_1}{(\omega L_1)^2 + R_1^2} - \frac{j}{\omega C_1} + \frac{j\omega L_1 R_1^2}{(\omega L_1)^2 + R_1^2}$$

resonance frequency for eigenmode 1 occurs when $$\frac{1}{\omega_1 C_1} = \frac{\omega_1 L_1 R_1^2}{(\omega_1 L_1)^2 + R_1^2}$$

or $$\omega_1^2 = \frac{R_1^2}{(C_1 L_1 R_1^2 - L_1^2)}.$$

The anti-resonance is caused by the cancellation of the combined eigenmode currents (the reactive part) at about 400 MHz. The eigenmodes are in parallel and have the same $V_0$. The impedance is calculated from the equation $$I_0 = \frac{V_0}{Z_0} = I_1 + I_2$$

TABLE 1

Eigenmodes for a disk loaded monopole

| Res. Freq. | Type | Q | $R_0$ | R | L | C | Vector Spherical Harmonics |
|---|---|---|---|---|---|---|---|
| | DC | | 8.96 | | | 12.0 pF | |
| 220.4 MHz | Dipole | 9.08 | 8.96 | 738.7 | 58.7 nH | 8.88 pF | $\sqrt{\frac{3}{8\pi}} \sin(\theta)$ |
| 1500 MHz | Octipole | 3 est | 11 est | 105 est | 3.61 nH | 3.12 pF | $\sqrt{\frac{21}{64\pi}} [5\sin^3(\theta) - 4\sin\theta]$ |

$$I_1 = \frac{V_0}{Z_1} \text{ and } I_2 = \frac{V_0}{Z_2}$$

The above equation is $$\frac{V_0}{Z_0} = \frac{V_0}{Z_1} + \frac{V_0}{Z_2}$$

or $$Z_0 = \frac{Z_1 * Z_2}{Z_1 + Z_2}.$$

FIG. 32 shows a plot of the impedance. The cancellation of the reactive current gives a high input resistance 400Ω and high negative slope in the reactance (anti-resonance). The high impedance values will create a high reflection from the antenna input (assuming a 50Ω source impedance). Antenna matching an antenna at anti-resonance is very difficult.

The following is an analysis of Stuart's data. At DC both the first and second eigenmode contributes to the radiation pattern. Table 2 (column 3) shows the quasi-static current flow at the feed point. Each vector spherical harmonic reduces to a unique electrostatic spherical harmonic in the quasi-static solution. It is believed that each eigenmode contributes a unique electrostatic spherical harmonic to the quasi-static solution. Thus the quasi-static solution contains information on the high frequency eigenmodes of the antenna.

TABLE 2

Quasi-static solution for a disk loaded monopole

| $\omega \ll \omega_1 < \omega_2$ | Type | Current | C | Spherical Harmonics |
|---|---|---|---|---|
| DC | | | 12.0 pF | |
| Eigenmode 1 | Dipole | $0.74 * I_0$ | 8.88 pF | $\sqrt{\frac{3}{4\pi}} \cos(\theta)$ |
| Eigenmode 2 | Octi-pole | $0.26 * I_0$ | 3.12 pF | $\sqrt{\frac{7}{4\pi}} \left[ \frac{5}{2}\cos^3(\theta) - \frac{3}{2}\cos\theta \right]$ |

The potential for a charge distribution is $$\psi(r, \theta, \phi) = \frac{1}{4\pi\varepsilon_0} \int\int\int q(r', \theta', \phi') \frac{1}{|r-r'|} \sin\theta dr' d\theta' d\phi'$$

$|r-r'|$ is the distance between the two vectors r and r'. The general potential can be expanded as the sum of $$\psi(r, \theta, \phi) = \sum_{l=1}^{\infty} \sum_{m=0}^{m=l} \frac{A_{lm}}{r^{l+1}} Y_{lm}(\theta, \phi) \text{ for } r > a$$

if the charge density is zero in this region, r>a. On this surface the $\psi(a, \theta, \phi)$ has a maximum value $\psi_{max}$. An equi-potential surface can be define with the potential $\psi_{max}$.

If this surface encloses all of the charge inside the sphere than the surface is identical to a perfect conductor. In addition, $\psi(r, \theta, \phi)$ is odd about $\theta=\pi/2$ (image charge distribution). The image charge distribution has a potential $-\psi_{max}$. Typically, the feedpoint(s) is in the plane $\theta=\pi/2$. The general solution could give isolated perfect conductors; implicit assumption is that isolated conductors are connected by very thin wire with negligible charge. The most practical solutions have one perfect conductor and image.

$$\int \psi(a, \theta, \phi) Y_{l'm'}(\theta, \phi) \sin\theta d\theta d\phi =$$

$$\sum_{l=1}^{\infty} \sum_{m=0}^{m=l} \frac{A_{lm}}{a^{l+1}} \int Y_{lm}(\theta, \phi) Y_{l'm'}(\theta, \phi) \sin\theta d\theta d\phi$$

$\int Y_{lm}(\theta,\phi) Y_{l'm'}(\theta,\phi) \sin\theta d\theta d\phi = \delta_{ll'}\delta_{mm'}$ $A_{lm} = a^{l+1} \int \psi(a,\theta,\phi) Y_{lm}(\theta,\phi) \sin\theta d\theta d\phi$ The terms $A_{lm}$ with m>0 can be eliminated by making $\psi(r, \theta, \phi)$ is independent of $\phi$.

$$Y_{l0}(\theta, \phi) = \sqrt{\frac{2l+1}{4\pi}} P_l(\cos\theta)$$

Since, the function $\psi(\theta)$ is odd about $\theta=\pi/2$; therefore, the even l vanish. The following are Legendre Polynomial for the parameters of a design from the cross-reference patent application entitled "Quasi-static Antenna Design Algorithm".

The potential $\psi(\theta)$ for a monopole, with the parameters in the following Table 3, is expanded with Legendre Polynomials. Column 2 is the Asymptotic Conical Dipole (ACD) with a line charge height κ. with the Legendre Polynomial coefficients. The TopLoad is give in Column (3) with a disk height of κ and radius a with the Legendre Polynomial coefficients. The height of the topload was selected to give a negative $a_3$ coefficient. The two solutions were combined to create an OSA with parameters in column (4). The parameter α is the weight factor for the topload and 1−α is the weight factor for the ACD. The equation for combining the Legendre polynomial coefficients ($a_1, a_3, a_5, a_7, a_9$)

$a_n(\text{col.4}) = (1-\alpha)*a_n(\text{col.2}) + \alpha*a_n(\text{col.3})$

TABLE 3

| | ACD | TopLoad | Minimum $P_3 = 0$ |
|---|---|---|---|
| κ | 0.45 | 0.45 | 0.45 |
| a | 0 | 0.5 | .5 |
| α | 0 | 1 | 0.5425183883422 |
| $a_1$ | 0.450304278947143 | 0.900317191185674 | 0.6730790 |
| $a_3$ | 0.047277383397228 | −0.039866913299692 | 0 |
| $a_5$ | 0.008915280356837 | −0.054190572656918 | −0.025320805315145 |

TABLE 3-continued

| | ACD | TopLoad | Minimum $P_3 = 0$ |
|---|---|---|---|
| $a_7$ | 0.004719340874386 | 0.014660689955097 | +0.010112705555601 |
| $a_9$ | 0.004960433018193 | 0.014316408426800 | +0.010036221718240 |

Figure 33:
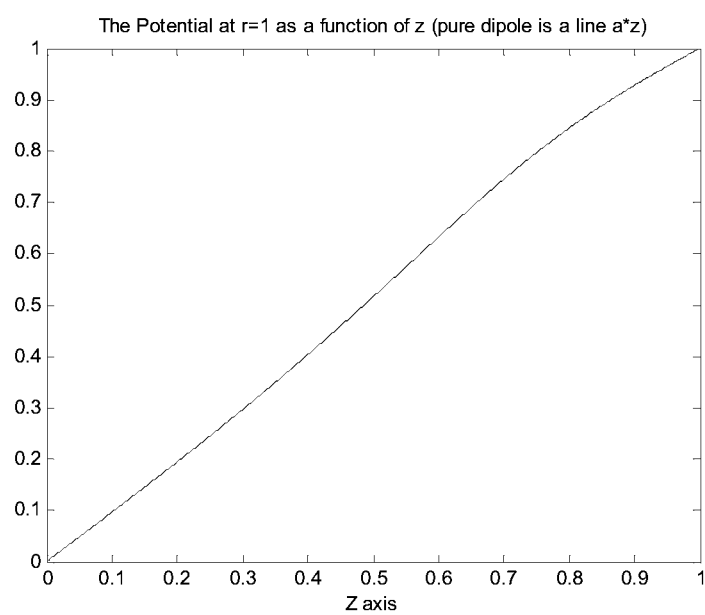
FIG. 33 shows a plot of potential as a function of impedance.

This is an example; there is a family of solutions with different Q and $R_{Rad}$ radiation resistance. The antenna shape for column 4 is shown in FIG. 32. The potential as a function of $z=\cos(\theta)$ is almost a straight line, as shown in FIG. 33.

This antenna is approximately a 70 degree cone at the feed point. This antenna should be a wideband antenna. The current practice is 'cut and try' where the antenna shape is changed manually. In addition, resistance may be added to improve performance.

The "Quasi-static Antenna Design Algorithm" was developed to design minimum Q electrically small antennas. This proposal modifies the code to compute the electrostatic spherical harmonics for the antenna solutions. Design curves would be generated. Eliminating an electrostatic spherical harmonic term should eliminate the corresponding eigenmode in the antenna. The capacitance for that eigenmode should be zero. An anti-resonance will also be eliminate. This would dramatically lower the antenna Q over an extended frequency range. The Smith chart will look like FIG. 34. The impedance will change slowly as a function of frequency. The antenna is will be tunable over a very high frequency range with a very wide bandwidth and low VSWR. The designs would be numerical modeled and physical antennas will be built.

In one embodiment, the "Quasi-static Antenna Design Algorithm" requires only 5 msec. to compute each antenna designs A NEC4 run of a similar antenna (100 unknowns) is about 0.1 sec. Additional complexity at the feed point increases the run time. It would be remarkable if ultra wide bandwidth antennas could be designed with a "Quasi-static Antenna Design Algorithm" referenced above.

Figure 34:
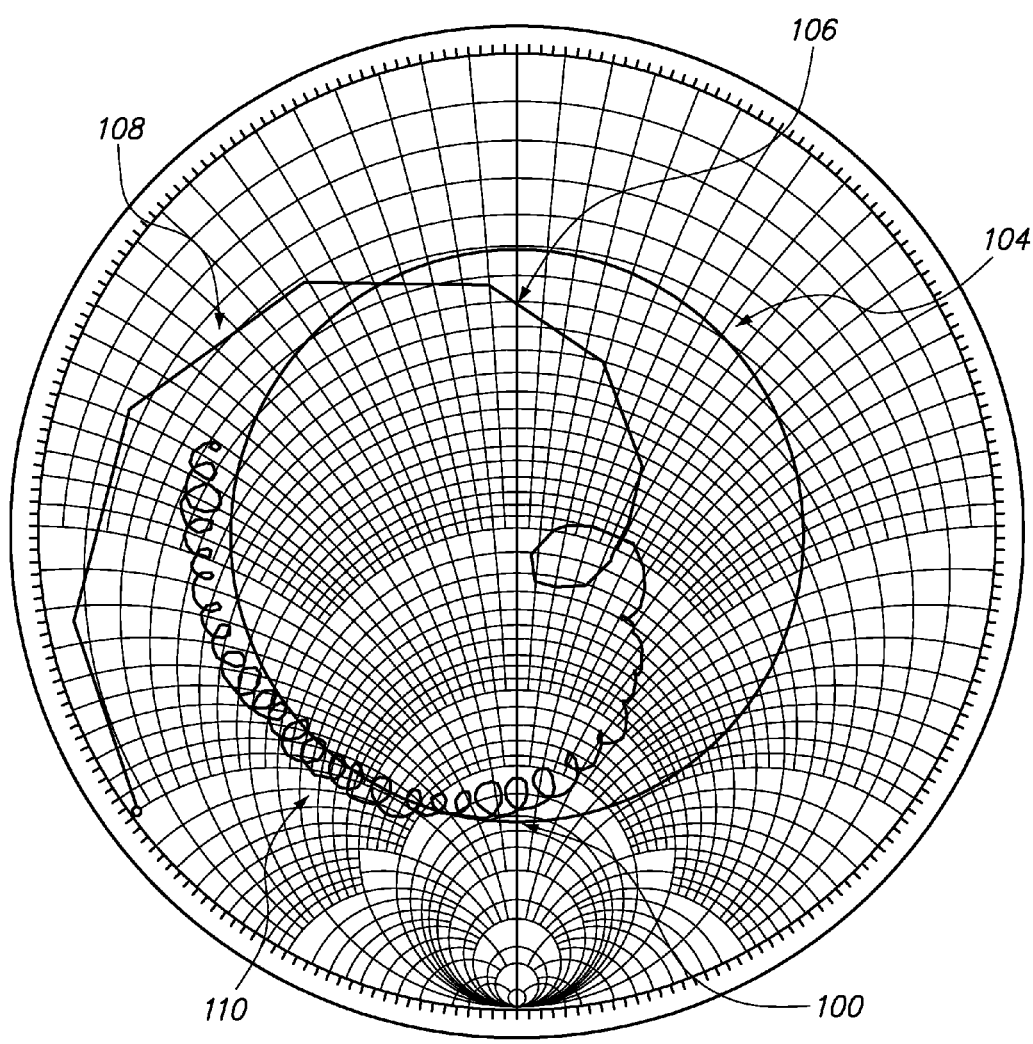
FIG. 34 shows a Smith chart between 40 MHz and 6000 MHz.

A Smith chart of an antenna typically has many anti-resonances. FIG. 34 shows the Smith chart, from 40 MHz to 6000 MHz, for the Linear Charge Distribution antenna (LCD). The LCD has only one anti-resonance at 2400 MHz, as shown at point 100. This anti-resonance is shallow with a 4 to 1 VSWR, as shown by circle 104. In FIG. 34, curve 108 shows changes occurring between 40 MHz and 6000 MHZ. It is observed that loops occur in the region 110 in FIG. 34, where the loops occur at approximately every 1/200 MHz.

The above analysis indicates that the antenna has only one eigenmode in the 40 MHz to 6000 MHz frequency range. This antenna was designed as an electrically small antenna with 16 wires approximating a continuous surface. The next step is to numerical model and manufacture a continuous surface LCD antenna. Electrostatic multipoles, Legendre Polynomial $P_3$, $P_5$, $P_7$, . . . , $P_{2n+1}$ charge distribution, could be added to eliminate the higher order eigenmodes. The modified designs would be numerical modeled and physical antennas can be manufactured. This antenna could have a dipole antenna pattern over an extended frequency range.

Figure 35:
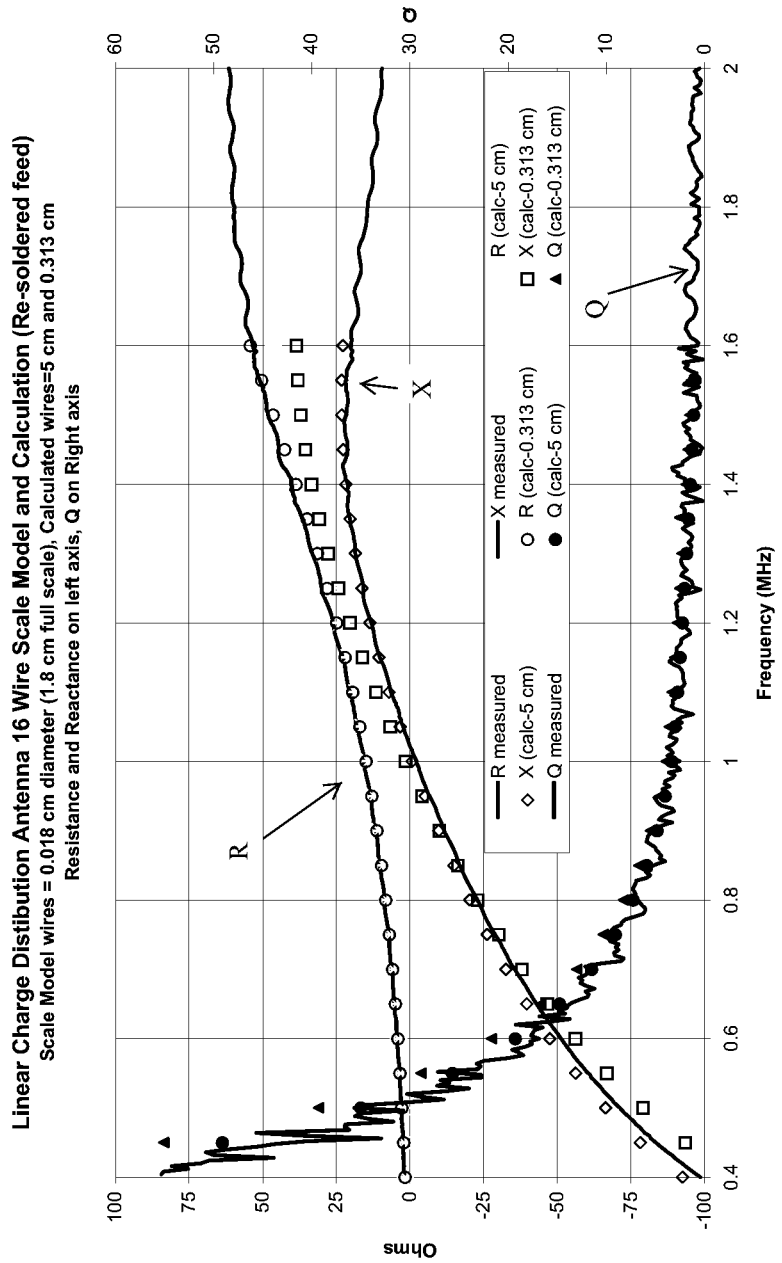
FIG. 35 shows a plot of resistance, reactance and Q between 0.4 MHz and 2 MHz.
Figure 36:
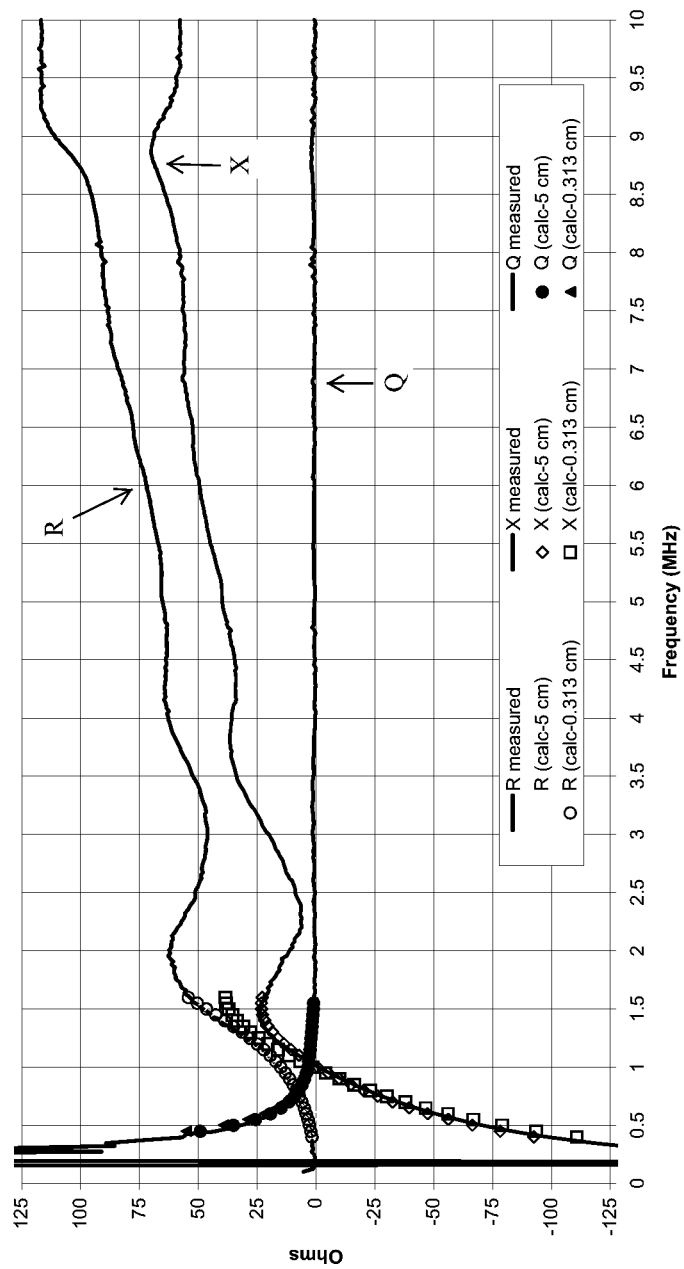
FIG. 36 shows a plot of resistance, reactance and Q between 0.4 MHz and 10 MHz.

Regarding FIGS. 35 and 36, the following description is based on a ½ meter antenna, scaling the frequency by 100.

FIG. 35 shows a plot of resistance R, Reactance X, and Q for a linear charge distribution (LCD) antenna 16 wire scale model and calculation between 0.4 MHz and 2 MHz. The scale model wires=0.018 cm diameter (1.8 cm full scale), and the calculated wires=5 cm and 0.313 cm. The resistance R and reactance X units are of the left axis, and the Q is on the right axis.

The measured curve R changes from near 0 ohms at 0.4 MHz to approximately 60 ohms at 2 MHz, and the measured reactance X curve changes from −j100 ohms at 0.4 MHz to nearly +j25 ohms around 1.4-1.6 MHz, then changes to approximately +j15 ohms at 2 MHz. The Q curve shows a change from about 80 at 0.4 MHz to approximately 0 at 2 MHz.

The measured plot R, X and Q curves shown in FIG. 35 compare favorably with the calculated values shown as diamond, circle, square and x symbols shown in the Table in FIG. 35.

Similarly, FIG. 36 shows a plot of measured R, X and Q values between 0.25 MHz and 10 MHz, with the Q value approaching 0 value between 1 and 10 MHz, and the R and X values increasing above 1 MHz. The reactance X is zero at 1 MHZ where the X curve has a positive slope at that point.

The impedance plot shown in FIG. 35 is very unusual. Normally the resistance and reactance increase to several hundred ohms to form an anti-resonance. An anti-resonance has a very high input impedance; which is difficult to match to 50 ohms. It appears that there is a very weak anti-resonance with the reactance approaching zero. Another interesting fact about this antenna is the Q steadily decreases to a value of about 2. Normally one would expect a kink in the curve at resonance. Below resonance the stored energy is capacitive and above resonance the stored energy is inductive. In other antennas design the Q changed slope at resonance with much slower rate of decrease in Q. These two observations were a motivation for extending the impedance measurements to higher frequencies.

The impedance plot FIG. 36 is also very unusual. The reactance has never goes through zero. There is no anti-resonance in this frequency range (100 MHz to 1000 MHz). In a dipole antenna there would be 3 anti-resonances near 300 MHz, 600 MHz, and 900 MHz (for ½ meter monopole) and resonances near 150 MHz, and 450 MHz. The Q appears to be below 2 from 150 MHz to 1000 MHz. The reactance is roughly linear; it appears that the antenna has extra inductance (123 nH) at the feed point. This may be caused by the very narrow wire at the feed point. Increasing this wire diameter would decrease the inductance and shift the reactance down. Adding extra wires to the antenna shape will also modify the impedance. Using an equation from Has Schantz's book the 16 wire design will have reduced gain at 600 Mhz. The ideal antenna would be a smooth continuous surface and would eliminate the drop in gain.

This antenna was designed as an electrically small antenna for the 50 MHz to 200 MHz band. It is remarkable that this antenna is an ultra wideband antenna with a VSWR<4 to 1 from 100 MHz to 2.4 GHz. It should be possible to greatly improve this design.

What has been described above includes examples of one or more embodiments. It is, of course, not possible to describe every conceivable combination of components or methodologies for purposes of describing the aforementioned embodiments. It will, therefore, be understood that many additional changes in the details, materials, steps and arrangement of parts, which have been herein described and illustrated to explain the nature of the invention, may be made by those skilled in the art within the principal and scope of the invention as expressed in the appended claims.

APPENDIX

Calculation of Potential for $P_3$ $$\int_{-L/2}^{L/2} \frac{P_3(2x/L)}{\sqrt{(x-z)^2+\rho^2}} dx = \int_{-L/2}^{L/2} \frac{\frac{5}{2}(2x/L)^3 - \frac{3}{2}(2x/L)}{\sqrt{(x-z)^2+\rho^2}} d$$

$$\int_{-L/2}^{L/2} \frac{P_3(2x/L)}{\sqrt{(x-z)^2+\rho^2}} dx = \int_{-L/2}^{L/2} \frac{\frac{5}{2}(2x/L)^3 - \frac{3}{2}(2x/L)}{\sqrt{(x-z)^2+\rho^2}} dx$$

$u=x-z$ and $du=dx$ $$\frac{5}{2}\frac{8}{L^3}\left[\frac{R_1^3-R_2^3}{3} + \frac{3z}{2}(L/2-z)R_1 + \frac{3z}{2}(L/2+zR_2) + (3z^2-\rho^2)(R_1-R_2) + \left(z^3 - \frac{3z\rho^2}{2}\right)\log\left(\frac{1+\tau}{1-\tau}\right)\right] - \frac{3}{2}\int_{-L/2}^{L/2}\frac{P_1(2x/L)}{\sqrt{(x-z)^2+\rho^2}} du$$

where $R_1 = \sqrt{(L/2-z)^2+\rho^2}$ and $R_2 = \sqrt{(L/2+z)^2+\rho^2}$ $$\frac{5}{2}\frac{8}{L^3}\left[\left(\frac{R_1^2-R_2^2}{6} + \frac{(R_1+R_2)^2}{6} + \left(\frac{3z^2}{2}-\rho^2\right)\right)(R_1-R_2) + \frac{3Lz}{4}(R_1-R_2) + \left(z^3 - \frac{3z\rho^2}{2}\right)\log\left(\frac{1+\tau}{1-\tau}\right)\right] - \frac{3}{2}\int_{-L/2}^{L/2}\frac{P_1(2x/L)}{\sqrt{(x-z)^2+\rho^2}} du$$

note $$(R_1-R_2) = \frac{(R_1^2-R_2^2)}{(R_1+R_2)} = \frac{-2Lz}{(R_1+R_2)}$$

and $R_1^2+R_2^2 = 2(z^2+(L/2)^2+\rho^2)$ $$\frac{5}{2}\frac{8}{L^3}\left[\frac{5L}{12}z(R_1+R_2) - 2z\tau\left(\frac{11}{6}z^2 + \frac{L^2}{12} - \frac{2}{3}\rho^2\right) + \left(z^3 - \frac{3}{2}z\rho^2\right)\log\left(\frac{1+\tau}{1-\tau}\right)\right] - \frac{3}{2}\left[\frac{2z}{L}\left(\ln\left(\frac{1+\tau}{1-\tau}\right) - 2\tau\right)\right]$$

Expansion of Multipoles and Analytic Calculations of Pure Dipole Solution

The calculation of the potential on the z axis allows the multipole expansion of the potential to be calculated. For $P_1(u)$, the potential on the z axis is $$\Psi_1(0,z) = \int_{-L/2}^{L/2} \frac{P_1(2x/L)}{\sqrt{(x-z)^2}} dx$$

Expanding this in a series $$\Psi_1(0,z) = \frac{1}{z}\int_{-L/2}^{L/2} P_1(2x/L)\left[1 + \frac{x}{z} + \left(\frac{x}{z}\right)^2 + \left(\frac{x}{z}\right)^3 + \left(\frac{x}{z}\right)^4 + + \left(\frac{x}{z}\right)^n\right] dx$$

where each term $$\left(\frac{1}{z^{m+1}}\right)$$

in the far field has an $P_m(\cos\theta)$ angular dependence. Changing variables to $u=2x/L$ and integrating term by term $$\Psi_1(0,z) = \frac{L}{2z}\int_{-1}^{1} P_1(u)\left[\left(\frac{Lu}{2z}\right) + \left(\frac{Lu}{2z}\right)^3 + + \left(\frac{Lu}{2z}\right)^{2m+1}\right] du$$

$$\Psi_1(0,z) = \frac{L}{2z}\int_{-1}^{1}\left[\frac{Lu^2}{2z} + \left(\frac{L}{2z}\right)^3 u^4 + \left(\frac{L}{2z}\right)^5 u^6 + \left(\frac{L}{2z}\right)^{m+1} u^{2m+2}\right] du$$

$$\Psi_1(0,z) = \frac{L}{2z}\left[\frac{2}{3}\left(\frac{L}{2z}\right)^1 + \frac{2}{5}\left(\frac{L}{2z}\right)^3 + \ldots + \frac{2}{(2m+3)}\left(\frac{L}{2z}\right)^{2m+1}\right]$$

For $P_3(u)$, the potential on the z axis is $$\Psi_3(0,z) = \int_{-L/2}^{L/2} \frac{P_3(2x/L)}{\sqrt{(x-z)^2}} dx$$

Expanding this in a series $$\Psi_3(0,z) = \frac{1}{z}\int_{-L/2}^{L/2} P_3(2x/L)\left[1 + \frac{x}{z} + \left(\frac{x}{z}\right)^2 + \left(\frac{x}{z}\right)^3 + \left(\frac{x}{z}\right)^4 + + \left(\frac{x}{z}\right)^n\right] dx$$

where each term $$\left(\frac{1}{z^{m+1}}\right)$$

in the far field has an $P_m(\cos\theta)$ angular dependence. Changing variables to $u=2x/L$ and integrating term by term $$\Psi_3(0,z) = \frac{L}{2z}\int_{-1}^{1} P_3(u)\left[\left(\frac{Lu}{2z}\right)^3 + \left(\frac{Lu}{2z}\right)^3 + \left(\frac{Lu}{2z}\right)^{2m+1}\right] du$$

$$\Psi_3(0, z) = \frac{L}{2z}\left[\frac{4}{35}\left(\frac{L}{2z}\right)^3 + \frac{8}{63}\left(\frac{L}{2z}\right)^5 + \ldots + \frac{4m}{(2m+5)(2m+3)}\left(\frac{Lu}{2z}\right)^{2m+1}\right]$$

The $\Psi_1(0, z)$ and $\Psi_3(0, z)$ can be combined with a $-7/2$ coefficient to cancel the $$\left(\frac{L}{2z}\right)^3$$

term in the far field.

$$\Psi_1(0, z) - \frac{7}{2}\Psi_3(0, z) = \frac{L}{2z}\left[\frac{2}{3}\left(\frac{L}{2z}\right)^1 + \frac{2}{5}\left(\frac{L}{2z}\right)^3 + \ldots + \frac{2}{(2m+3)}\left(\frac{L}{2z}\right)^{2m+1}\right] + \\ -\frac{7L}{4z}\left[\frac{4}{35}\left(\frac{L}{2z}\right)^3 + \frac{8}{63}\left(\frac{L}{2z}\right)^5 + \ldots + \frac{4m}{(2m+5)(2m+3)}\left(\frac{L}{2z}\right)^{2m+1}\right]$$

$$\Psi_1(0, z) - \frac{7}{2}\Psi_3(0, z) = \left[\frac{2}{3}\frac{L}{(2z)^2} + \frac{2L^3}{5(2z)^4} + \ldots + \frac{2L^{2m+1}}{(2m+3)(2z)^{2m+2}}\right] - \\ \frac{7}{2}\left[\frac{4L^3}{35(2z)^4} + \frac{8L^5}{63(2z)^6} + \ldots + \frac{4mL^{2m+1}}{(2m+5)(2m+3)(2z)^{2m+2}}\right]$$

(Note: the above two lines are one equation)

$$\Psi_1(0, z) - \frac{7}{2}\Psi_3(0, z) = \\ \frac{L}{2z}\left[\frac{2}{3}\left(\frac{L}{2z}\right)^1 - \frac{10}{63}\left(\frac{L}{2z}\right)^5 + \ldots + \frac{2(5-5m)}{(2m+3)(2m+5)}\left(\frac{L}{2z}\right)^{2m+1}\right]$$

$$\Psi_1(0, z) - \frac{7}{2}\Psi_3(0, z) = \\ \frac{L}{2z}\left[\frac{2}{3}\left(\frac{L}{2z}\right)^1 - \frac{10}{63}\left(\frac{L}{2z}\right)^5 + \ldots + \frac{-10(m-1)}{(2m+3)(2m+5)}\left(\frac{L}{2z}\right)^{2m+1}\right]$$

Additional terms, $\Psi_5(0, z)$, could be used to cancel the $$\left(\frac{L}{2z}\right)^5$$

term. By using a succession of line sources $P_1$, $P_3$, $P_5$ and $P_7$ an antenna with a pure dipole far field can be generated. The error in the far field is $\Psi_9(\rho,z)$.

Radiation Resistance

The effective height for a positively charged distribution is normally calculated with the equation $$h_{eff} = \int_0^{d/2} x\frac{q(x)}{q_{Net}}dx.$$

where the feedpoint is at the ground plane. In the general, the definition must proceed from fundamental concepts. From Jackson the power radiated from a dipole is $$P = 10c^2k^4|p|^2$$

where P is the dipole moment $$p = \int xq(x)d^3x$$

for a cylindrical symmetric dipole, this reduces to $$p_z = \int_{-d/2}^{d/2} zq(x)d^3x$$

where by $p_x=0$ and $p_y=0$. The radiation resistance is defined in terms of the total power radiated as $$P = R_{Rad}\frac{I_{fp}^2}{2}$$

where the $I_{fp}$ is the peak current (½ converts peak to rms). In our model, negative charge below the feedpoint is part of the image current. This current is calculated from the continuity equation.

$$I_{fp} = i\omega\int_{fp}^{d/2} q(x)d^3x$$

$$P = 10c^2k^4|p|^2$$

If we limit the antenna to a symmetric dipole, this equation reduces to $$P = 10c^2k^4|2\int_0^{d/2} zq(x)d^3x|^2$$

$$P = 10c^2k^4|I_{fp}|^2\left[\frac{2\int_0^{d/2} zq(x)d^3x}{I_{fp}}\right]^2$$

$$P = 10c^2k^4\left[\frac{2\int_0^{d/2} zq(x)d^3x}{\omega\int_{fp}^{d/2} q(x)d^3x}\right]^2|I_{fp}|^2$$

$$P = 40k^2\left[\frac{\int_0^{d/2} zq(x)d^3x}{\int_{fp}^{d/2} q(x)d^3x}\right]^2|I_{fp}|^2$$

$$P = 80k^2\left[\frac{\int_0^{d/2} zq(x)d^3x}{\int_{fp}^{d/2} q(x)d^3x}\right]^2\frac{I_{fp}^2}{2}$$

$$P = R_{Rad}\frac{I_{fp}^2}{2}$$

If the feedpoint current is the same as the net charge $$R_{Rad-Dipole} = 80k^2 \left[\frac{\int_0^{d/2} zq(x)d^3x}{\int_{fp}^{d/2} q(x)d^3x}\right]^2$$

$$R_{Rad-Monopole} = 40k^2 \left[\frac{\int_0^{d/2} zq(x)d^3x}{\int_{fp}^{d/2} q(x)d^3x}\right]$$

The quantity in the square bracket is $h_{eff}$. This equation can be reduces to the usual results, when $q(x)=1$ and $q(x)=\delta(z-d/2)$.

The calculation for $$q(x) = \frac{2q}{\kappa h}\left(P_1\left(\frac{x}{\kappa h}\right) + \alpha P_3\left(\frac{x}{\kappa h}\right)\right)$$

will be discussed in detail below.

$$P_z = \int_{-\kappa h}^{\kappa h} x \frac{2q}{\kappa h}\left(P_1\left(\frac{x}{\kappa h}\right) + \alpha P_3\left(\frac{x}{\kappa h}\right)\right)dx$$

changing variables $$u = \frac{x}{\kappa h}$$

$p_z = 2q\kappa h \int_{-1}^{1} u(P_1(u)+\alpha P_3(u))du$

Since $u=P_1(u)$ and $\int P_1(u)P_3(u)du=0$ $p_z = 2q\kappa h \int_{-1}^{1} u^2 du$ $$p_z = 2q\kappa h \left[\frac{u^2}{2}\right]_{-1}^{1} = 2q\kappa h$$

The same variable change is made for $$q_{fp} = \int_{-fp}^{\kappa h} \frac{2q}{\kappa h}\left(P_1\left(\frac{x}{\kappa h}\right) + \alpha P_3\left(\frac{x}{\kappa h}\right)\right)dx$$

$q_{fp} = 2q \int_{-fp}^{1} (P_1(u)+\alpha P_3(u))dx$

This following calculation are performed with the $$q_{Net}(u) = 2q\left[u + \frac{\alpha}{2}(5u^3 - 3u)\right] = 0$$

$qu[2+\alpha(5u^2-3)]=0$ $u[2+\alpha 5u^2-3\alpha]=0$ $$u^2 = \sqrt{\frac{3\alpha - 2}{5\alpha}}$$

For $\alpha \leq 2/3$ the feedpoint is at the ground. Note: $\alpha > 2/3$ $$u_{fp} < \frac{1}{\sqrt{5}} \quad I_{fp-Peak} = \omega q\left(1 - \frac{\alpha}{4}\right).$$

$$q_{fp} = 2q_0 \int_{u_{fp}}^{1} \left[u + \frac{\alpha}{2}(5u^3 - 3u)\right]du$$

$$q_{fp} = q_0\left[u^2 + \alpha\left(\frac{5}{4}u^4 - \frac{3}{2}u^2\right)\right]_{u_{fp}}^{1}$$

$$q_{fp} = q_0\left[u^2\left(1 + \frac{5}{4}\alpha u^2 - \frac{3}{2}\alpha\right)\right]_{u_{fp}}^{1}$$

$$q_{fp} = q_0\left[u^2\left(1 - \frac{3\alpha}{2} + \frac{5\alpha}{4}u^2\right)\right]_{u_{fp}}^{1}$$

$$q_{fp} = q_0\left[\left(1 - \frac{3\alpha}{2} + \frac{5\alpha}{4}\right) - \left(\frac{3\alpha - 2}{5\alpha}\right)\left(1 - \frac{3\alpha}{2} + \frac{5\alpha}{4}\frac{3\alpha - 2}{5\alpha}\right)\right]$$

$$q_{fp} = q_0\left[\left(1 - \frac{3\alpha}{2} + \frac{5\alpha}{4}\right) - \left(\frac{3\alpha - 2}{5\alpha}\right)\left(1 - \frac{3\alpha}{2} + \frac{3\alpha - 2}{4}\right)\right]$$

$$q_{fp} = q_0\left[\left(1 - \frac{\alpha}{4}\right) - \left(\frac{3\alpha - 2}{5\alpha}\right)(3\alpha - 2)\left(\frac{1}{4} - \frac{1}{2}\right)\right]$$

$$q_{fp} = q_0\left[\left(1 - \frac{\alpha}{4}\right) + \left(\frac{3\alpha - 2}{20\alpha}\right)(3\alpha - 2)\right]$$

$$q_{fp} = q_0\left[\left(1 - \frac{\alpha}{4}\right) + \frac{(3\alpha - 2)^2}{20\alpha}\right]$$

The following is a verification that $P_3$ has no dipole moment $$\Psi_3(0, z) = \int_{-L/2}^{L/2} \frac{P_3(2x/L)}{\sqrt{(x-z)^2}} dx.$$

Expanding this in a series $$\Psi_3(0, z) = \frac{1}{z}\int_{-L/2}^{L/2} P_3(2x/L)\left[1 + \frac{x}{z} + \left(\frac{x}{z}\right)^2 + \left(\frac{x}{z}\right)^3 + \left(\frac{x}{z}\right)^4 + + \left(\frac{x}{z}\right)^n\right]dx$$

where each term $$\left(\frac{1}{z^{m+1}}\right)$$

in the far field has an $P_m(\cos\theta)$ angular dependence. Changing variables to $u=2x/L$ and integrating term by term $$\Psi_3(0, z) = \frac{L}{2z}\int_{-1}^{1} P_3(u)\left[\left(\frac{Lu}{2z}\right)^3 + \left(\frac{Lu}{2z}\right)^3 + \left(\frac{Lu}{2z}\right)^{2m+1}\right]du$$

$$\Psi_3(0, z) = \frac{L}{2z}\int_{-1}^{1} P_3(u)\left[\left(\frac{Lu}{2z}\right)^3 + \left(\frac{Lu}{2z}\right)^5 + \left(\frac{Lu}{2z}\right)^{2m+1}\right]du$$

$$\Psi_3(0, z) = \frac{L}{2z}\left[\frac{4}{35}\left(\frac{L}{2z}\right)^3 + \frac{8}{63}\left(\frac{L}{2z}\right)^5 + \ldots + \frac{4m}{(2m+5)(2m+3)}\left(\frac{Lu}{2z}\right)^{2m+1}\right]$$

The third order Legendre polynomial does not contribute to the diople field $$p_z = \frac{2q}{\kappa h}\int_{-\kappa h}^{\kappa h} x[P_1(x/\kappa h)dx + \alpha P_3(x/\kappa h)]dx = 2q\kappa h\int_{-1}^{1} u[P_1(u)dx + \alpha P_3(u)]du.$$

$$p_z = 2q\kappa h\int_{-1}^{1} u[P_1(u)dx + \alpha P_3(u)]du$$

$$p_z = 2q\kappa h\left[\frac{u^3}{3}\right]_{-1}^{1} = 4q\kappa h/3$$

Inversion of Oblate Spheroid Coordinates
An oblate spheroid has two limiting cases a sphere and a disk.
$x = a\cos h\, u \cos v \cos\phi$
$y = a\cos h\, u \cos v \sin\phi$
$z = a\sin h\, u \sin v$
If one uses oblate spheroid coordinates with rotational symmetry on the z-axis.

$\rho = a\cos h\, u \cos v$ $\rho^2 = a^2(1+\sin h^2 u)\cos^2 v$ $$\rho^2 = a^2\left(1 + \left(\frac{z}{a\sin v}\right)^2\right)\cos^2 v$$

$\rho^2 \sin^2 v = (a^2 \sin^2 v + z^2)\cos^2 v$ $\rho^2 + z^2 = a(\sin h^2 u \sin^2 v + (1+\sin h^2 u)\cos^2 v)$ $$\left(\frac{R}{a}\right)^2 = (\sinh^2 u + \cos^2 v)$$

$$\frac{z}{a\sinh u} = \sin v$$

$$\frac{\rho}{a\cosh u} = \cos v$$

$$\left(\frac{z}{a\sinh u}\right)^2 + \left(\frac{\rho}{a\cosh u}\right)^2 = 1$$

$z'^2(1+\sin h^2 u) + \rho'^2 \sin h^2 u = \sin h^2 u(1+\sin h^2 u)$ $\sin h^2 u(1+\sin h^2 u) - z'^2(1+\sin h^2 u) - \rho'^2 \sin h^2 u$ $\sin h^4 u + \sin h^2 u(1 - z'^2 - \rho'^2)\sin h^2 u - z'^2 = 0$ $\sin h^4 u - (z'^2 + \rho'^2 - 1)\sin h^2 u - z'^2 = 0$ $$\sinh^4 u - (z'^2 + \rho'^2 - 1)\sinh^2 u + \frac{(z'^2 + \rho'^2 - 1)^2}{4} - \frac{(z'^2 + \rho'^2 - 1)^2}{4} - z'^2 = 0$$

$$\left(\sinh^2 u - \frac{(z'^2 + \rho'^2 - 1)}{2}\right)^2 - \frac{(z'^2 + \rho'^2 - 1)^2}{4} - z'^2 = 0$$

$$\sinh^2 u = \frac{(z'^2 + \rho'^2 - 1)}{2} + \frac{\sqrt{(z'^2 + \rho'^2 - 1)^2 + 4z'^2}}{2}$$

There are three algebraically equivalent solutions. The first case is for $r<a$ $$\sinh^2 u = \frac{2z^2}{(a^2 - r^2) + \sqrt{(a^2 - r^2)^2 + 4a^2 z^2}} \text{ for } r < a$$

if z=0

$$\sinh^2 u = \frac{\rho^2 - a^2}{a^2} \text{ for } z = 0 \text{ and } \rho > a$$

if ρ=0

$$\sinh^2 u = \left(\frac{z}{a}\right)^2 \text{ for } \rho = 0$$

The second case r=a $$\sinh^2 u = \frac{z}{a} \text{ for } r = a$$

The third case r>a $$\sinh^2 u = \frac{1}{2a^2}\left((r^2 - a^2) + \sqrt{(r^2 - a^2)^2 + 4a^2 z'^2}\right) \text{ for } r > a$$

$$\frac{z}{a \sin v} = \sinh u$$

$$\frac{\rho}{a \cos v} = \cosh u$$

$$\left(\frac{\rho}{a \cos v}\right)^2 - \left(\frac{z}{a \sin v}\right)^2 = 1$$

$(\rho' \sin v)^2 - (z' \cos v)^2 = \cos^2 v \sin^2 v$ $\rho'^2 \sin^2 v - z'^2(1 - \sin^2 v) = (1 - \sin^2 v)\sin^2 v$ $\rho'^2 \sin^2 v - z'^2(1 - \sin^2 v) - (1 - \sin^2 v)\sin^2 v = 0$ $\rho'^2 \sin^2 v + z'^2(\sin^2 v - 1) + (\sin^2 v - 1)\sin^2 v = 0$ $\sin^4 v + (\rho'^2 + z'^2 - 1)\sin^2 v - z'^2 = 0$ $$\sin^4 v + (\rho'^2 + z'^2 - 1)\sin^2 v + \frac{(\rho'^2 + z'^2 - 1)^2}{4} - \frac{(\rho'^2 + z'^2 - 1)^2}{4} - z'^2 = 0$$

$\sin^2 v = \frac{1}{2}(\rho'^2 + z'^2 - 1) + \frac{1}{2}\sqrt{(\rho'^2 + z'^2 - 1)^2 + 4z'^2}$ $\sin^2 v = -\frac{1}{2}(r'^2 - 1) + \frac{1}{2}\sqrt{(r'^2 - 1)^2 + 4z'^2}$ There are three algebraically equivalent solution. The first case is for r<a $$\sin^2 v = \frac{1}{2a^2}(a^2 - r^2) + \frac{1}{2a^2}\sqrt{(a^2 - r^2)^2 + 4a^2 z^2} \text{ for } r < a$$

if z=0

$$\sin^2 v = \frac{1}{a^2}(a^2 - \rho^2) \text{ for } z = 0$$

if ρ=0

$$\sin^2 v = \frac{z^2}{a^2} \text{ for } \rho = 0$$

The second case r=a $$\sin^2 v = \frac{z^2}{a^2} \text{ for } r = a$$

The third case r > a $$\sin^2 v = \frac{2z^2}{(r^2 - a^2) + \sqrt{(r^2 - a^2)^2 + 4a^2 z^2}} \text{ for } r > a$$

$$\left[(3 + 9\xi^2)\operatorname{arccot}(\xi) - 3\xi(1 + \xi^2)\frac{1}{\xi^2 + 1} - 3\xi - 3\xi\right] - $$
$$3[(3\xi^2 + 1)\operatorname{arccot}(\xi) - 3\xi] = 0$$

Calculation of the Oblate Spheroid Potential $h_u = a(\sinh^2 u + \sin^2 v)^{1/2}$ $h_v = a(\sinh^2 u + \sin^2 v)^{1/2}$ $h_\phi = a \cosh u \cos v$ $$\nabla^2 \Psi = \frac{1}{h_u h_v h_\phi}\left[\partial_u \frac{h_v h_\phi}{h_u}\partial_u + \partial_v \frac{h_u h_\phi}{h_v}\partial_v + \partial_\phi \frac{h_v h_u}{h_\phi}\partial_\phi\right]\Psi$$

$$\nabla^2 \Psi = $$
$$\frac{1}{h_u h_v h_\phi}\left[\partial_u a\cosh u \cos v \partial_u + \partial_v a\cosh u \cos v \partial_v + \partial_\phi \frac{a\sinh^2 u + \sin^2 v}{\cosh u \cos v}\partial_\phi\right]\Psi$$

$$\nabla^2 \Psi = \frac{1}{a^3 \cosh u \cos v (\sinh^2 u + \sin^2 v)}$$
$$\left[a\cos v \partial_u \cosh u \partial_u + a\cosh u \partial_v \cos v \partial_v + \frac{a\sinh^2 u + \sin^2 v}{\cosh u \cos v}\partial_\phi \partial_\phi\right]\Psi$$

$$\nabla^2 \Psi = \left[\frac{1}{a^2 \cosh u(\sinh^2 u + \sin^2 v)}\partial_u \cosh u \partial_u + \right.$$

-continued $$\frac{1}{a^2\cos v(\sinh^2 u + \sin^2 v)}\partial_v \cos v\partial_v + \frac{1}{a^2\cosh^2 u\cos^2 v}\partial_\varphi \partial_\varphi \bigg]\Psi$$

If we assume that constant u forms equipotential surfaces the $\Psi(u)$ $$\nabla^2\Psi = \left[\frac{1}{a^2\cosh u(\sinh^2 u + \sin^2 v)}\partial_u \cosh u\partial_u\right]\Psi = 0$$

the solution is $\cos h\, u\partial_u\Psi = K$ $$\Psi(u) = \int \frac{K}{\cos hu}du = K\arctan(\sinh u) + C$$

the solution is $$\Psi(u) = K\left(\frac{\pi}{2} - \arctan(\sinh u)\right)$$

The constant K is related to the total charge.

$$E_u = \frac{1}{a(\sinh^2 u + \sin^2 v)^{1/2}}\partial_u \Psi$$

$q = \epsilon_0 \int E_u dA$ where $dA = h_v h_\varphi dvd\varphi = a^2(\sin h^2 u + \sin^2 v)^{1/2} \cos h\, u \cos v\, dv d\varphi$ $$q = \epsilon_0 \int\int \frac{1}{a(\sinh^2 u + \sin^2 v)^{1/2}} \frac{K}{a\cos hu} a^2(\sin h^2 u + \sin^2 v)^{1/2}$$

$\cos h\, u \cos v\, dv d\varphi$ $q = \epsilon_0 \int_{-\pi/2}^{\pi/2}\int_0^{2\pi} aK \cos v\, dv d\varphi$ $q = \epsilon_0 \int_{-\pi/2}^{\pi/2} 2\pi aK \cos v\, dv = \epsilon_0 2\pi Ka[\sin v]_{-\pi/2}^{\pi/2} = \epsilon_0 4\pi aK$ $K = q/4\pi a\epsilon_0$ $$\Psi(u) = \frac{q}{4\pi a\epsilon_0}\left(\frac{\pi}{2} - \arctan(\sinh u)\right)$$

The potential on the surface is $$\Psi(0) = \frac{q}{8a\epsilon_0}$$

$C = 8a\epsilon_0$ $$E_u = \frac{1}{a(\sinh^2 u + \sin^2 v)^{1/2}} \frac{q}{4\pi a\epsilon_0 \cos hu}$$

$$E_u(v) = \frac{q}{a^2 4\pi\epsilon_0 \sin v}$$

where $\rho = a\cos v$ $$E_u(\rho) = \frac{q}{4\pi\epsilon_0\sqrt{(a^2 - \rho^2)}}$$

$$\sigma = \epsilon_0 E_u(\rho) = \frac{q}{4\pi a\sqrt{(a^2 - \rho^2)}}$$

$$\sigma = \epsilon_0 E_u(\rho) = \frac{q}{4\pi a\sqrt{(a^2 - \rho^2)}}$$

General Solution of Laplace's Equation $$\nabla^2\Psi = \left[\frac{1}{a^2\cosh u(\sinh^2 u + \sin^2 v)}\partial_u \cosh u\partial_u + \frac{1}{a^2\cos v(\sinh^2 u + \sin^2 v)}\partial_v \cos v\partial_v + \frac{1}{a^2\cosh^2 u\cos^2 v}\partial_\varphi \partial_\varphi\right]\Psi$$

$$a^2(\sinh^2 u + \sin^2 v)\nabla^2\Psi = \left[\frac{1}{\cosh u}\partial_u \cosh u\partial_u + \frac{1}{\cos v}\partial_v \cos v\partial_v + \frac{(\sinh^2 u + \sin^2 v)}{\cosh^2 u\cos^2 v}\partial_\varphi \partial_\varphi\right]\Psi = 0$$

In the cylindrical symmetry case $\partial_\varphi \Psi = 0$ and separation of variables $\Psi = \Phi(v)K(u)$ The above equation reduces to $$\left[l(l+1) + \frac{1}{\cos v}\partial_v \cos v\partial_v\right]\Phi(v)$$

and $$\left[\frac{1}{\cosh u}\partial_u \cosh u\partial_u - l(l+1)\right]K(u)$$

The solution in v is the standard Legendre Polynomials $\Phi(v) = P_l(v)$ and $K(u) = P_l(iu)$ In our case, the second $$K_2(iu) = i\frac{1}{2}(3u^2 + 1)\text{arccot}(u) - i\frac{3}{2}u$$

The verifying the solution in u is the $$K_2(iu) = i\frac{1}{2}(3u^2+1)\operatorname{arccot}(u) - i\frac{3}{2}u$$

$$\partial_\xi(1+\xi^2)\partial_\xi\left[\frac{1}{2}(3\xi^2+1)\operatorname{arccot}(\xi) - \frac{3}{2}\xi\right] -$$

$$6\left[\frac{1}{2}(3\xi^2+1)\operatorname{arccot}(\xi) - \frac{3}{2}\xi\right]$$

$$\partial_\xi(1+\xi^2)\left[3\xi\operatorname{arccot}(\xi) - \frac{1}{2}(3\xi^2+1)\frac{1}{\xi^2+1} - \frac{3}{2}\right] -$$

$$6\left[\frac{1}{2}(3\xi^2+1)\operatorname{arccot}(\xi) - \frac{3}{2}\xi\right]$$

$$\partial_\xi\left[3\xi(1+\xi^2)\operatorname{arccot}(\xi) - \frac{1}{2}(3\xi^2+1) - \frac{3}{2}(1+\xi^2)\right] -$$

$$3[(3\xi^2+1)\operatorname{arccot}(\xi) - 3\xi]$$

$$\left[(3+9\xi^2)\operatorname{arccot}(\xi) - 3\xi(1+\xi^2)\frac{1}{\xi^2+1} - 3\xi - 3\xi\right] -$$

$$3[(3\xi^2+1)\operatorname{arccot}(\xi) - 3\xi] = 0$$

What is claimed is:

1. A computer implemented method for designing a wide bandwidth antenna comprising:
    the wide bandwidth antenna having multiple antenna eigenmodes which decay via radiation loss where each eigenmode has a resonant frequency and a unique antenna radiation pattern which is related to an electrostatic spherical harmonic; defining, using the computer, a charge distribution in terms of at least one form factor related parameter representing the shape of the wideband antenna where a Legendre polynomial expansion of electrostatic potential is linked to a respective eigenmode of the wideband wide bandwidth antenna; and
    modifying one or more eigenmodes of the wide bandwidth antenna to form one or more modified eigenmodes by modifying the charge distribution and linked Legendre polynomial coefficient.

2. The computer implemented method of claim 1 wherein a modified eigenmode has a reduced capacitance.

3. The computer implemented method of claim 2 wherein the resonant frequency of the modified eigenmode is moved to a higher frequency.

4. The computer implemented method of claim 3 wherein one or more nulls in the antenna radiation pattern are eliminated or reduced.

5. The computer implemented method of claim 4 wherein antenna impedance measured at a feedpoint of the antenna has a reduced number of resonance and anti-resonance occurrences.

6. The computer implemented method of claim 5 wherein antenna impedance measured at the feedpoint has a lower VSWR (voltage standing wave ratio) at the anti-resonance.

7. A computer implemented method for designing a wide bandwidth antenna comprising:
    the wide bandwidth antenna having multiple antenna eigenmodes which decay via radiation loss where each eigenmode has a resonant frequency and a unique antenna radiation pattern which is related to an electrostatic spherical harmonic;
    defining, using the computer, a charge distribution in terms of at least one form factor related parameter representing the shape of the wide bandwidth antenna where a Legendre polynomial expansion of the electrostatic potential is linked to a respective eigenmode of the wide bandwidth antenna where the effective circuit for the eigenmode has a reduced capacitance;
    modifying one or more eigenmodes of the wideband antenna to form one or more modified eigenmodes by modifying the charge distribution and linked Legendre polynomial coefficient such that the resonant frequency of the modified eigenmode is moved to a higher frequency and one or more nulls in the antenna radiation pattern are reduced.

8. A computer implemented method for designing a wide bandwidth antenna, comprising:
    the wide bandwidth antenna having multiple antenna eigenmodes which decay via radiation loss where each eigenmode has a resonant frequency and a unique antenna radiation pattern which is related to an electrostatic spherical harmonic;
    designating a general form factor for the wide bandwidth antenna;
    defining, using the computer, a charge distribution in terms of at least one form factor related parameter representing the shape of the wide bandwidth antenna;
    computing a DC capacitance in terms of the charge distribution and the form factor related parameter where the DC capacitance is the sum of effective capacitances of eigenmodes of the wide bandwidth antenna and where each eigenmode is linked to a respective electrostatic spherical harmonic;
    generating a quasi-static quality factor (Q) based on the computed DC capacitance and a corresponding radiation resistance;
    evaluating values of the generated quasi-static Q, the computed DC capacitance, and the radiation resistance to arrive at a desired wide bandwidth antenna performance;
    eliminating one or more of the respective electrostatic spherical harmonics; and
    generating a selected antenna geometry using the form factor related parameter for the selected wide bandwidth antenna performance.

* * * * *